(12) United States Patent
Idjadi et al.

(10) Patent No.: US 10,700,492 B2
(45) Date of Patent: Jun. 30, 2020

(54) INTEGRATED POUND-DREVER-HALL LASER STABILIZATION SYSTEM

(71) Applicant: The Trustees of the University of Pennsylvania, Philadelphia, PA (US)

(72) Inventors: Mohamad Hossein Idjadi, Philadelphia, PA (US); Firooz Aflatouni, Penn Valley, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 0 days.

(21) Appl. No.: 16/239,653

(22) Filed: Jan. 4, 2019

(65) Prior Publication Data

US 2019/0229494 A1   Jul. 25, 2019

Related U.S. Application Data

(60) Provisional application No. 62/614,344, filed on Jan. 5, 2018.

(51) Int. Cl.

| H01S 3/13 | (2006.01) |
|---|---|
| H01S 5/0687 | (2006.01) |
| H01S 5/06 | (2006.01) |
| H01S 5/068 | (2006.01) |
| H01S 5/026 | (2006.01) |
| H01S 5/00 | (2006.01) |
| H01S 5/0683 | (2006.01) |
| H01S 5/02 | (2006.01) |

(Continued)

(52) U.S. Cl.
CPC .............. *H01S 5/0687* (2013.01); *G02F 1/00* (2013.01); *H01S 5/0085* (2013.01); *H01S 5/021* (2013.01); *H01S 5/0262* (2013.01); *H01S 5/0265* (2013.01); *H01S 5/02248* (2013.01); *H01S 5/0617* (2013.01); *H01S 5/0683* (2013.01); *H01S 5/06817* (2013.01)

(58) Field of Classification Search
CPC .... H01S 5/0687; H01S 5/0617; H01S 5/0683; H01S 5/06817; H01S 5/021; H01S 5/0085; H01S 5/0262; H01S 5/0265

See application file for complete search history.

(56) References Cited

U.S. PATENT DOCUMENTS

| 4,856,899 A * | 8/1989 | Iwaoka ..................... G01J 9/04 356/454 |
|---|---|---|
| 4,893,353 A * | 1/1990 | Iwaoka ..................... G02F 1/11 398/183 |

(Continued)

OTHER PUBLICATIONS

Abbott, ft, et al., LIGO: the laser interferometer gravitational-wave observatory, Rep. Prog. Phys 72, 2009, 076901.

(Continued)

*Primary Examiner* — Kinam Park
(74) *Attorney, Agent, or Firm* — BakerHostetler

(57) ABSTRACT

A laser frequency control apparatus comprising: (a) a laser; (b) an oscillator configured to receive an output of the laser and to output a modulated signal; (c) a frequency reference configured to receive the modulated signal and to provide an output signal; and (d) a mixer configured to mix at least a portion of the output signal with an output of the oscillator to generate a mixer output, wherein the mixer output is injected to a section of the laser.

17 Claims, 25 Drawing Sheets

(51) Int. Cl.
  *H01S 5/022* (2006.01)
  *G02F 1/00* (2006.01)

(56) References Cited

U.S. PATENT DOCUMENTS

| | | | | |
|---|---|---|---|---|
| 5,717,708 | A * | 2/1998 | Mells | H01S 5/0687 |
| | | | | 372/32 |
| 6,175,579 | B1 * | 1/2001 | Sandford | H01S 3/08036 |
| | | | | 372/32 |
| 7,650,080 | B2 * | 1/2010 | Yap | G02F 2/02 |
| | | | | 398/161 |
| 7,697,579 | B1 | 4/2010 | Delfyett et al. | |
| 2006/0239312 | A1 * | 10/2006 | Kewitsch | H01S 5/0683 |
| | | | | 372/29.023 |
| 2016/0254646 | A1 * | 9/2016 | Li | H01S 3/0627 |
| | | | | 372/32 |

OTHER PUBLICATIONS

Abediasl, H. &, Hashemi, H., Monolithic optical phased-array transceiver in a standard SOI CMOS process, Opt. Express, 2015, 23, 6509-6519.

Aflatouni, F. &, Hashemi, H., Wideband tunable laser phase noise reduction using single sideband modulation in an electro-optical feed-forward scheme, Opt. Lett., 2012, 37, 196-198.

Aflatouni, F., Bagheri, M. & Hashemi, H., Design methodology and architectures to reduce the semiconductor laser phase noise using electrical feedforward schemes, IEEE Trans. Microw. Theory Techn., 2010, 58, 3290-3303.

Aflatouni, F., et al., Electronic laser phase noise reduction, IEEE RFIC Symp., 2013, 265-268.

Al-Taiy, H., et al., Ultra-narrow linewidth, stable and tunable laser source for optical communication systems and spectroscopy, Opt. Lett., 2014, 39, 5826-5829.

Barwicz, T., et aL, Silicon photonics for compact, energy-efficient interconnects, J. Opt. Netw., 2007, 6, 63-73.

Black, E. D., An introduction to Pound—Drever—Hall laser frequency stabilization, Am. J. Phys, 2001, 69, 79-87.

Bogaerts, W., et al., Silicon microring resonators, Laser Photon. Rev, 2012, 6, 47-73.

Chijioke, A., Chen, Q.-F., Nevsky, A. Y. &, Schiller, S.,Thermal noise of whispering-gallery resonators, Phys. Rev. A, 2012, 85, 053814.

Cygan, A., et al., Cavity mode-width spectroscopy with widely tunable ultra narrow laser, Opt. Express, 2013, 21, 29744-29754.

Dahmani, B., Hollberg, L &, Drullinger, R., Frequency stabilization of semiconductor lasers by resonant optical feedback, Opt. Lett., 1987, 12, 876-878.

Dreyer, R., et al., Laser phase and frequency stabilization using an optical resonator, Appl. Phys. B, 1983, 31, 97-105.

Gorodetsky, M. L. &, Grudinin, I. S., Fundamental thermal fluctuations in microspheres, J. Opt. Soc. Am, 2004, 21, 697-705.

Hajimiri, A. & Lee, T. H., A general theory of phase noise in electrical oscillators, IEEE J. Solid-State Circuits, 1998, 33, 179-194.

Idjadi et al., "Integrated Pound-Drever-Hall laser stabilization system in silicon", Nature Communications, Oct. 31, 2017, 8:1209, 9 pages.

Jiang, Y., et al., Making optical atomic clocks more stable with 10-16-level laser stabilization, Nat. Photon., 2011, 5, 158-161.

Khachaturian, A., Abiri, B., Zhou, A. & Hajimiri, A., Monolithic Mach-Zehnder Interferometer Modulator in an unmodified CMOS process, IEEE Photonics Conference (IPC), 2015, 394-395.

Lang, R. &, Kobayashi, K., External optical feedback effects on semiconductor injection laser properties, IEEE J. Quant. Electron, 1980, 16, 347-355.

Lee, H., et al., Spiral resonators for on-chip laser frequency stabilization, Nat. Commun., 2013, 4, 6 pages.

Magden, E. S., et al., Laser Frequency Stabilization Using Pound-Drever-Hall Technique with an Integrated TiO 2 Athermal Resonator. Conference on Lasers and Electro-Optics (CLEO), 2016, STu1H.3.

Minin et al., Acoustojet: acoustic analogue of photonic jet phenomenon based on penetrable 3D particle, Opt Quant Electron, 2017, 49:54, 6 pages.

Numata, K., Kemery, A. &, Camp, J., Thermal-noise limit in the frequency stabilization of lasers with rigid cavities, Phys. Rev. Lett., 2004, 93, 250602.

Ohtsu, M. &, Kotajima, S., Linewidth reduction of a semiconductor laser by electrical feedback, IEEE J. Quant. Electron, 1985, 21, 1905-1912.

Ohtsu, M., Murata, M. &, Kourogi, M., FM noise reduction and subkilohertz linewidth of an AlGaAs laser by negative electrical feedback., IEEE J. Quant. Electron, 1990, 26, 231-241.

Reed, G. T., Mashanovich, G., Gardes, F. &, Thomson, D., Silicon optical modulators, Nat. Photon., 2010, 4, 518-526.

Saito, S., Nilsson, O. &, Yamamoto, Y., Coherent FSK transmitter using a negative feedback stabilised semiconductor laser, Electron. Lett., 1984, 20, 703-704.

Sorace-Agaskar, C., Leu, J., Watts, M. R. &, Stojanovic, V., Electro-optical co-simulation for integrated CMOS photonic circuits with VerilogA., Opt. Express, 2015, 23, 27180-27203.

Spencer, D. T., et al., Stabilization of heterogeneous silicon lasers using Pound-Drever-Hall locking to Si 3 N 4 ring resonators, Opt. Express, 2016, 24, 13511-13517.

Sun, C., et al., Single-chip microprocessor that communicates directly using light, Nature, 2015, 528, 534-538.

Takamoto, M., Hong, F-L., Higashi, R. &, Katori, H., An optical lattice clock, Nature, 2005, 435, 321-324.

Thorpe, M. J., et al., Frequency stabilization to 6x [times] Oct. 16, 2016 via spectral-hole burning, Nat. Photon., 2011, 5, 688-693.

Udem, T., Holzwarth, R. &, Hansch, T. W., Optical frequency metrology, Nature, 2002, 416, 233-237.

Yariv, A., Dynamic analysis of the semiconductor laser as a current-controlled oscillator in the optical phased-lock loop: applications, Opt. Lett., 2005, 30, 2191-2193.

* cited by examiner

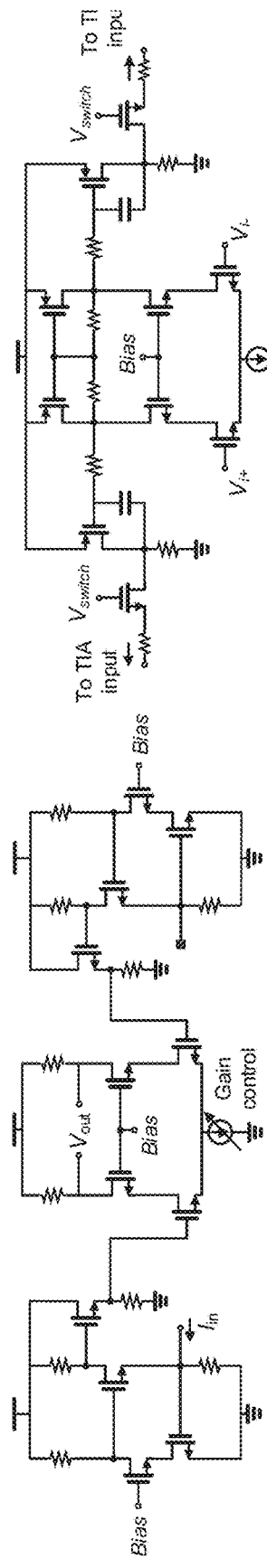
FIG. 14A
FIG. 14B
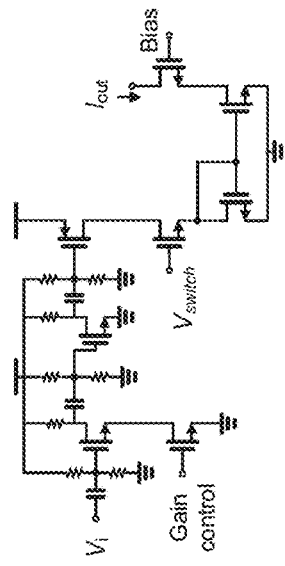
FIG. 14C
FIG. 14D
FIG. 14E
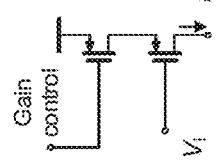
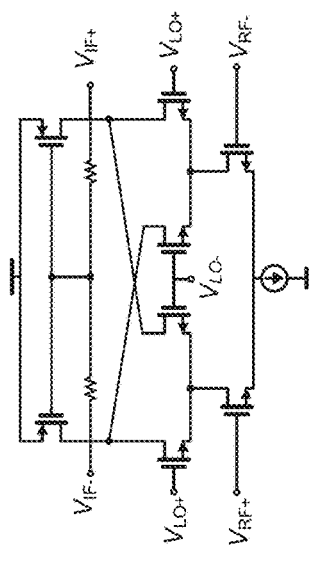
FIG. 14F
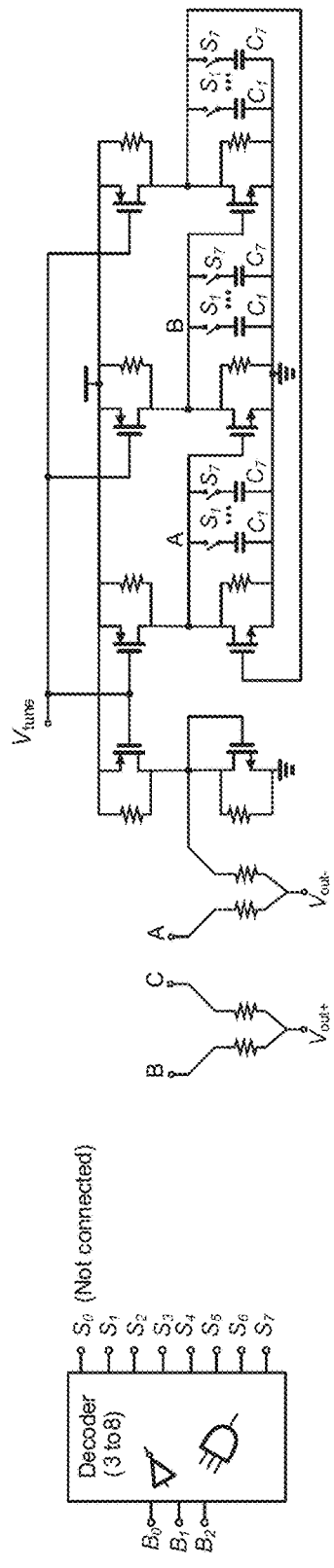
FIG. 14G

INTEGRATED POUND-DREVER-HALL LASER STABILIZATION SYSTEM

CROSS REFERENCE TO RELATED APPLICATIONS

This application claims priority to U.S. Provisional Patent Application No. 62/614,344, filed Jan. 5, 2018, the entirety of which is incorporated by reference herein.

GOVERNMENT RIGHTS

This invention was made with government support under Grant No. HR0011-15-C-0057 awarded by DARPA DODOS. The Government has certain rights in the invention.

TECHNICAL FIELD

The invention relates to laser stabilization and more particularly to a Pound-Drever-Hall (PHD) frequency stabilization system.

BACKGROUND

A compact laser source with low frequency fluctuations is an important component in many applications such as optical communication, spectroscopy, atomic clock, astronomy, and metrology. A key part of a semiconductor laser, directly affecting its stability, is the frequency selective component such as the resonator or the cavity. In semiconductor lasers, the fluctuations in the resonator are mainly caused by thermal variations of the cavity length and index of refraction as well as the elasto-optic effect. Laser stabilization using optical feedback, electrical feedback, and electrical feedforward techniques have been demonstrated. However, the most widely used method in laser stabilization is the Pound-Drever-Hall (PDH) scheme, where the frequency of the laser is measured using an optical frequency reference and the error signal in the electrical domain is amplified, filtered, and fed back to the laser to suppress the laser frequency fluctuations. Bench-top PDH systems have been demonstrated where a high quality factor cavity or resonator in a carefully controlled environment is used to stabilize the laser frequency. Despite excellent stabilization performance, these bench-top systems are bulky, expensive, power hungry, and highly sensitive to environmental fluctuations.

There Standard complementary metal-oxide semiconductor (CMOS) silicon-on-insulator (SOI) processes offer high optical confinement, high yield, scalability to mass production, and co-integration with standard electronic devices and circuits and therefore are a suitable platform for monolithic integration of electronic-photonic systems in the infrared regime.

SUMMARY

Low noise stable lasers have far-reaching applications in spectroscopy, communication, metrology and basic science. The Pound-Drever-Hall laser stabilization technique is widely used to stabilize different types of lasers in these areas. Here, we report the demonstration of an integrated Pound-Drever-Hall system that can stabilize a low-cost laser chip to realize a compact inexpensive light source which can ultimately impact many fields of science and engineering. We present an integrated architecture utilizing an electronically reconfigurable Mach-Zehnder interferometer as the frequency reference to reduce the frequency noise of semiconductor lasers by more than 25 dB and the relative Allan deviation by more than 12 times at 200 µs averaging time. Compared to the bench-top implementations, the integrated Pound-Drever-Hall system has significantly lower power consumption, less sensitivity to the environmental fluctuations and occupies 2.38 mm$^2$ area. The photonic and electronic devices are integrated on a standard 180 nm complementary metal-oxide semiconductor silicon-on-insulator process.

The present disclosure relates to an integrated PDH frequency stabilization system based on a novel architecture where an electronically reconfigurable Mach-Zehnder interferometer (MZI) is used as the frequency reference. With a careful design of the on-chip optical delay line and the implemented electronically adjustable phase-control and loss-matching mechanisms in the MZI, a large extinction ratio and hence a high frequency selectivity is achieved while the entire integrated PDH system only occupies an area of 2.38 mm$^2$. In comparison with the bench-top implementations, where a high quality factor resonator or cavity in a well-controlled environment is used, the small temperature gradient across the integrated PDH system significantly reduces the sensitivity to the environment fluctuations, which is a key advantage for an integrated PDH stabilization system. In addition, the use of a highly reconfigurable MZI instead of an integrated resonator greatly reduces the sensitivity to the process variations resulting in higher fabrication yield. Benefiting from the low noise design of the integrated electronic blocks and the high extinction ratio of the integrated reconfigurable MZI, the frequency noise of a commercially available distributed feedback (DFB) laser is reduced by more than 25 dB while no temperature control for the integrated PDH system is used. The stabilized DFB laser exhibits more than 12 times relative Allan deviation reduction at 200 µs averaging time. All passive and active photonic components are designed and co-integrated with electronic devices on the GlobalFoundries GF7RFSOI process, a standard 180 nm CMOS SOI technology, with no post-processing.

With streaming movies and UltraHD television taking more and more bandwidth, there is a race to deliver data into people's homes as quickly as possible. Light-based fiber optic connections promise far faster data rates than standard electricity-based coaxial cables, so making laser sources smaller, cheaper and more stable is a high priority for engineers.

Stability is particularly important because, rather than simply representing bits by whether the laser is on or off, information could also be encoded in the light wave's harder-to-control frequency or phase. Additional layers of data can multiply a laser's transfer speed, but mass-market lasers aren't stable enough to carry a signal through the noise in those properties.

In an embodiment, a silicon microchip is provided that reduces the noise of low-cost lasers, enabling them to use the laser's phase to transmit data. This microchip measures the noise in the laser's phase in the form of an electrical current, then suppresses the noise by injecting that current back to the laser in a feedback loop. This method, known as the Pound-Drever-Hall (PDH) technique, is a mainstay of laser stabilization, but has thus far only been implemented as benchtop-sized systems. This chip enables information to be encoded in both intensity and phase of a low-cost laser, multiplying the data rate for the same available bandwidth. For example, compared to two-level intensity encoding, you can get four times the data rate if you encode information in eight phase points on top of two intensity levels.

In exemplary embodiments, a laser frequency control apparatus comprising: (a) a laser; (b) an oscillator configured to receive an output of the laser and to output a phase modulated signal; (c) an interferometer configured to receive the phase modulated signal and to provide an output signal; and (d) a mixer configured to mix at least a portion of the output signal of the interferometer with an output of the oscillator to generate a mixer output, wherein the mixer output is injected to a gain section of the laser.

The scope of the invention also includes a system including a processor that executes stored instructions for executing the steps of the method. The above and other characteristic features of the invention will be apparent from the following detailed description of the invention.

BRIEF DESCRIPTION OF THE DRAWINGS

The present application is further understood when read in conjunction with the appended drawings. In the drawings:

FIG. 14A shows a trans-impedance amplifier (TIA) and the high frequency amplifier. The TIA input current, $I_{in}$, is amplified and converted to a differential output voltage, $V_{out}$.

FIG. 14B shows a DC offset compensation loop. The TIA output is amplified, low-pass filtered and injected back to the TIA input to compensate for the DC offset. The feedback loop can be disabled by setting the switch voltage, $V_{switch}$, to zero.

FIG. 14C shows a frequency mixer. The input differential radio frequency (RF) voltage, $V_{RF+}-V_{RF-}$, is mixed with the differential local oscillator (LO) voltage, $V_{LO+}-V_{LO-}$, to generate the differential intermediate frequency (IF) voltage, $V_{IF+}-V_{IF-}$.

FIG. 14D shows a voltage-to-current convertor (VtoI). The VtoI converts its input voltage, $V_i$, to a current, $I_{out}$, which is injected to the laser.

FIG. 14E shows a phase modulator driver. The input voltage, $V_i$, is converted to a current, $I_{out}$, driving the phase modulator. The gain and phase responses of the driver can be adjusted.

FIG. 14F shows an oscillator channel select circuit. A 3×8 digital decoder is used to select one of the 7 frequency channels of the oscillator, $S_1$ to $S_7$, using 3 control bits, $B_1$ to $B_3$.

FIG. 14G shows a voltage-controlled ring oscillator. The channel selection for the 3-stage RF ring oscillator is performed by adjusting the switchable capacitors, $C_1$ to $C_7$, in the oscillator stages and the fine tuning is performed by adjusting the tuning voltage, $V_{tune}$. The differential output of the oscillator, $V_{out+}-V_{out-}$, is buffered and routed to the modulator driver and the mixer.

DETAILED DESCRIPTION OF ILLUSTRATIVE EMBODIMENTS

Integrated PDH Principle of Operation

Figure 1A:
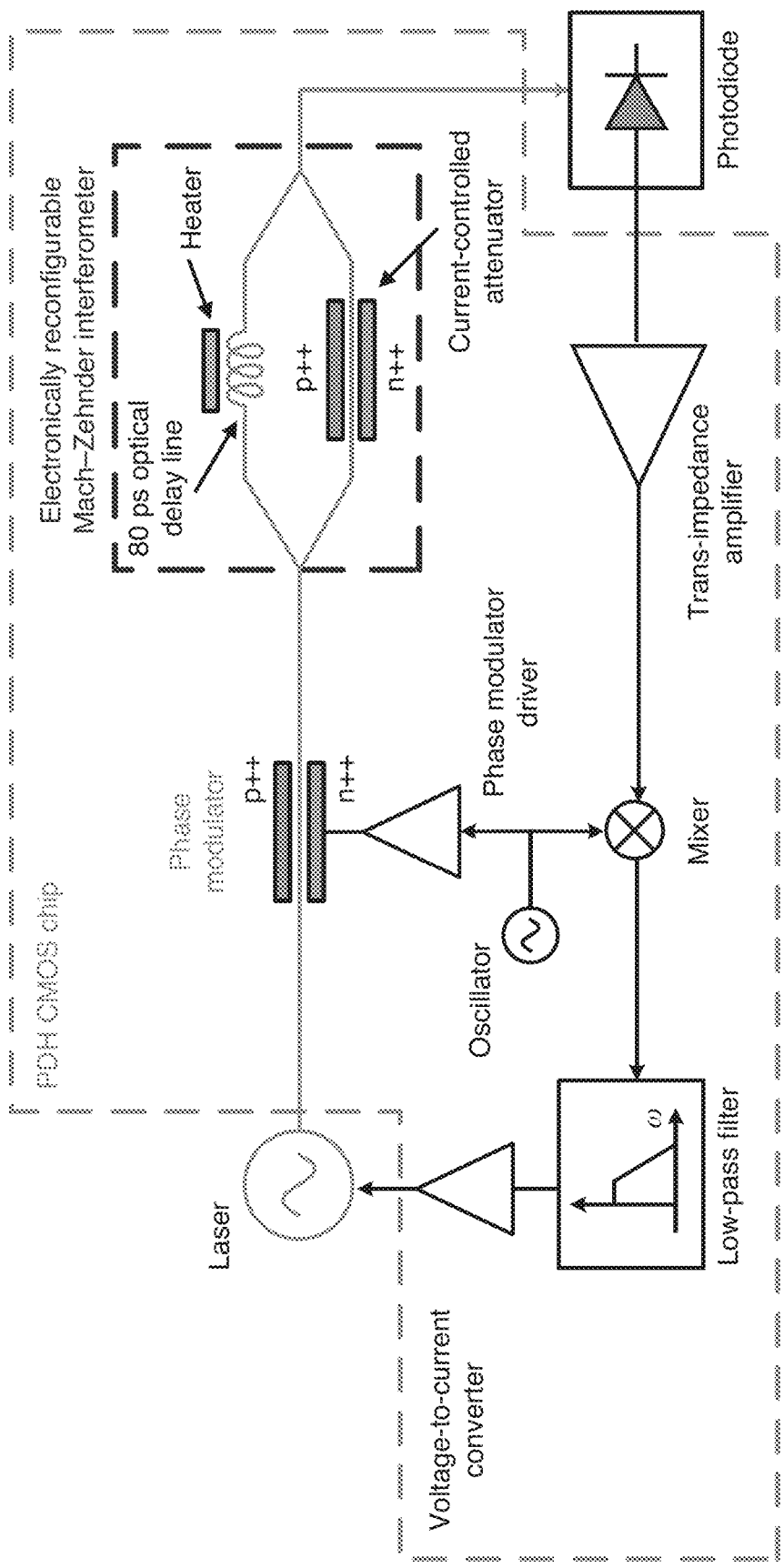
FIG. 1A shows a block diagram of a Pound-Drever-Hall (PDH) chip implemented on 180 nm GF7RFSOI complementary metal-oxide semiconductor (CMOS) silicon-on-insulator (SOI) process, in accordance with an aspect of the present disclosure. The laser output is phase modulated using a p-doped-intrinsic-n-doped (PIN) phase modulator, passed through the electronically reconfigurable Mach-Zehnder interferometer (MZI) with 80 ps delay imbalance, and photo-detected. The photo-current is amplified and converted to a voltage using a trans-impedance amplifier (TIA) and mixed with the same electrical signal used to phase modulate the laser. The mixer output is filtered, amplified, converted to a current, and injected to the laser gain section to lock the laser to the notch in the MZI frequency response. The output of the voltage-to-current converter, the read-out signal, is asymmetric with respect to the frequency of the notch in the MZI frequency response, $f_{notch}$. Therefore, the read-out signal indicates both the difference between the laser frequency and $f_{notch}$ and whether the laser frequency is greater or less than $f_{notch}$ (Supplementary Note 1). Note that the modulation sidebands are essential to detect the sign of the read-out (error) signal required to tune the laser towards $f_{notch}$.

FIG. 1A shows a block diagram of the reported integrated PDH system. An electrical local oscillator (LO) is used to phase modulate the output of the laser using a p-doped-intrinsic-n-doped (PIN) modulator creating side-bands around the lasing frequency. The phase modulated signal passes through the electronically reconfigurable MZI acting as the frequency selective component. The MZI output is photo-detected and the photo-current is amplified and converted to a voltage using a trans-impedance amplifier (TIA) and mixed with the output of the LO. The mixer output is low-pass filtered, amplified, converted to a current using a voltage-to-current convertor (VtoI) and injected to the gain section of the laser. As discussed in Supplementary Note 1, the VtoI output current, the read-out signal, is asymmetric with respect to the frequency of the notch in the MZI frequency response, $f_{notch}$. Therefore, the read-out signal indicates both the difference between the laser frequency and $f_{notch}$ and whether the laser frequency is greater or less than $f_{notch}$.

Figure 1B:
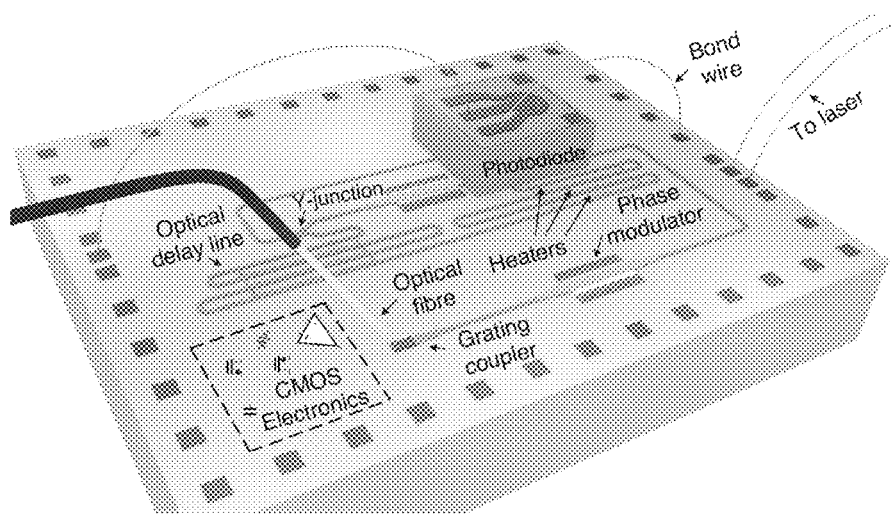
FIG. 1B shows the structure of the PDH system of FIG. 1A.
Figure 1C:
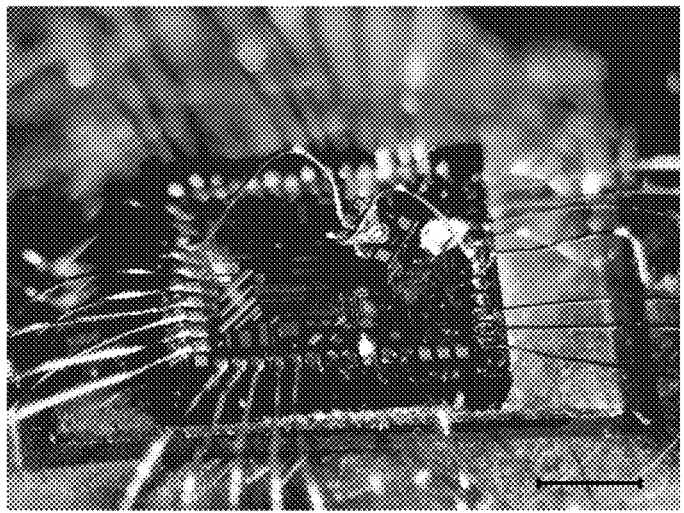
FIG. 1C shows a micro-photograph of the CMOS chip with a photodiode mounted on top. The details of the integrated CMOS chip are described herein below. The hybrid integration of the photodiode chip with the CMOS chip is discussed herein below.

FIG. 1B shows the structure of the implemented PDH system. The laser is coupled into the CMOS chip using a grating coupler, and guided using nanophotonic waveguides to a PIN modulator. The modulated signal is guided to the reconfigurable MZI. The MZI output is backside-coupled to a vertical InGaAs photodiode (which is hybrid integrated with the CMOS chip) using a grating coupler. The output of the photodiode is wire-bonded to the input of the electronic circuits on the CMOS chip for further processing. The output of the chip is fed back to the laser to close the PDH loop. FIG. 1C shows the micro-photograph of the implemented PDH system. All electronic and photonic devices are monolithically integrated on the 180 nm GF7RFSOI CMOS SOI process except for the photodiode which is hybrid integrated (vertically) with the CMOS chip. The details of the integrated CMOS chip are included in Supplementary Note 5 and FIG. 13. The hybrid integration of the photodiode chip with the CMOS chip is discussed in Supplementary Note 8.

Design and Characterization of the Photonic Components

Figure 2A:
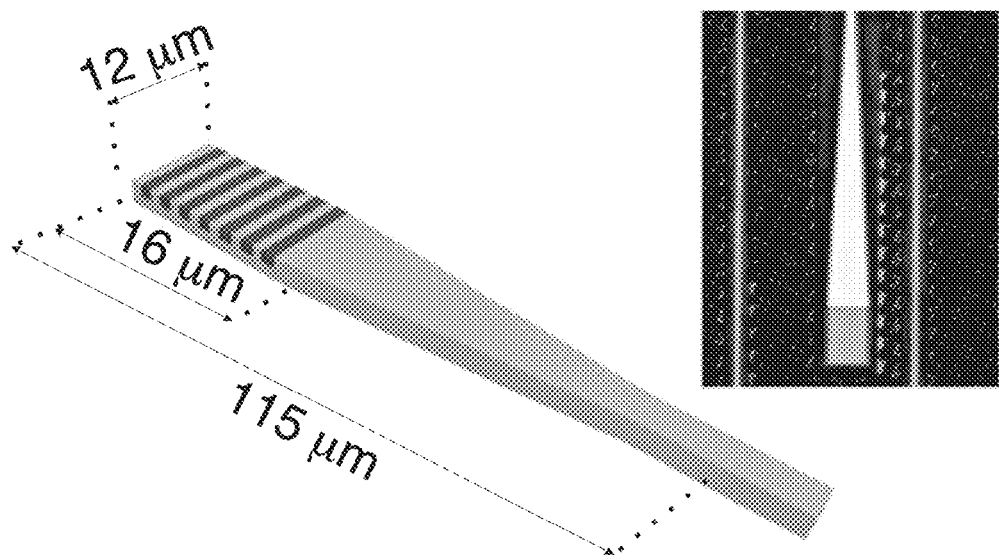
FIG. 2A shows the test structure of the grating coupler, in accordance with an aspect of the present disclosure.
Figure 2B:
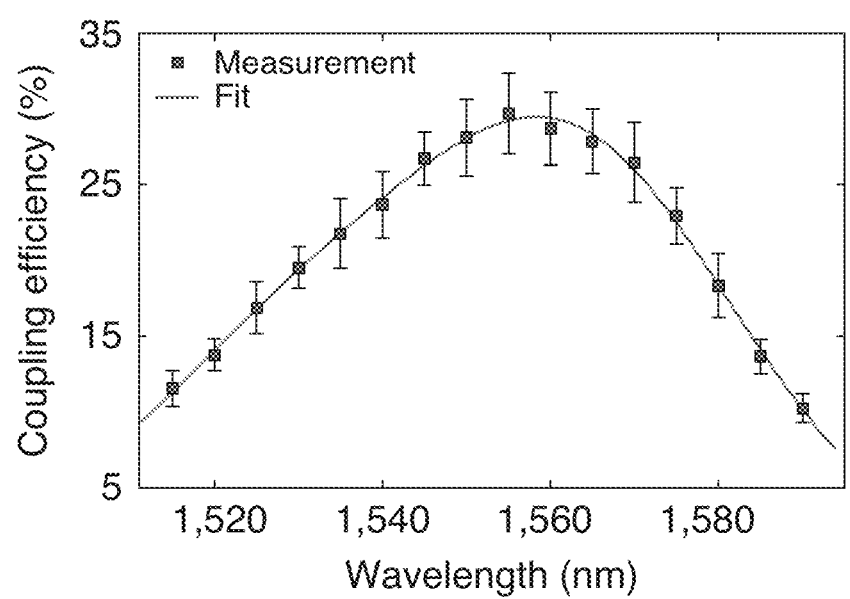
FIG. 2B shows the coupling efficiency of the grating coupler as a function of wavelength for coupling angle of 17°.
Figure 2C:
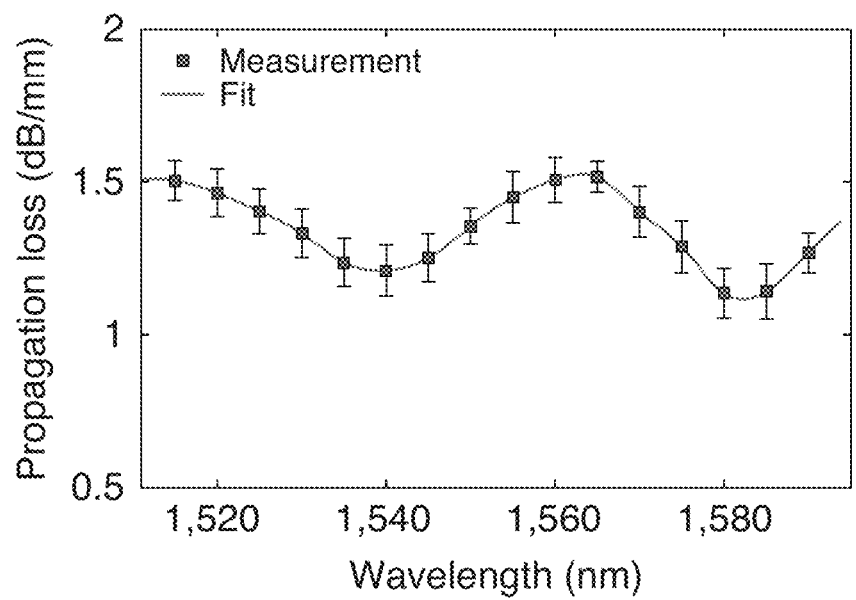
FIG. 2C shows the measured propagation loss of a 1 mm long 500 nm wide waveguide after de-embedding the effect of grating couplers.
Figure 2D:
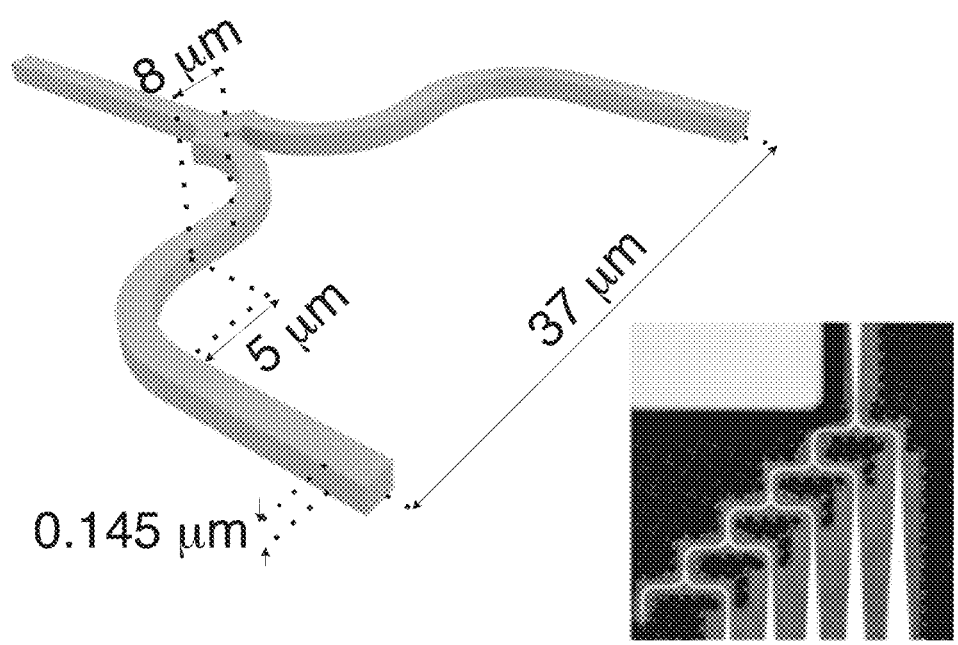
FIG. 2D shows the structure of the implemented Y-junction.
Figure 2E:
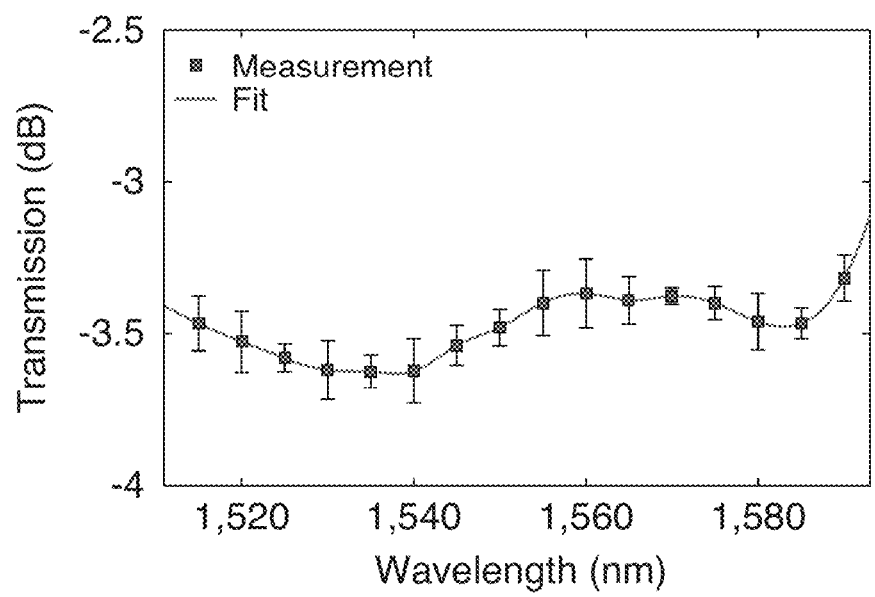
FIG. 2E shows the measured transmission of the implemented Y-junctions versus wavelength.

Several active and passive photonic components have been designed and characterized for implementation of the integrated PDH system on the GlobalFoundries GF7RFSOI CMOS process. FIG. 2A shows the structure of the implemented grating coupler with measured 28% average peak efficiency at 1550 nm (FIG. 2B). The measured propagation loss of a 1 mm long 500 nm wide nanophotonic waveguide is depicted in FIG. 2C. The average excess loss of the implemented Y-junction in FIG. 2D is about 0.5 dB as depicted in FIG. 2E. Note that the error bars in FIG. 2B, FIG. 2C, and FIG. 2E represent the standard deviations of the measured data for 8 chips fabricated in two GF7RFSOI runs.

Figure 2F:
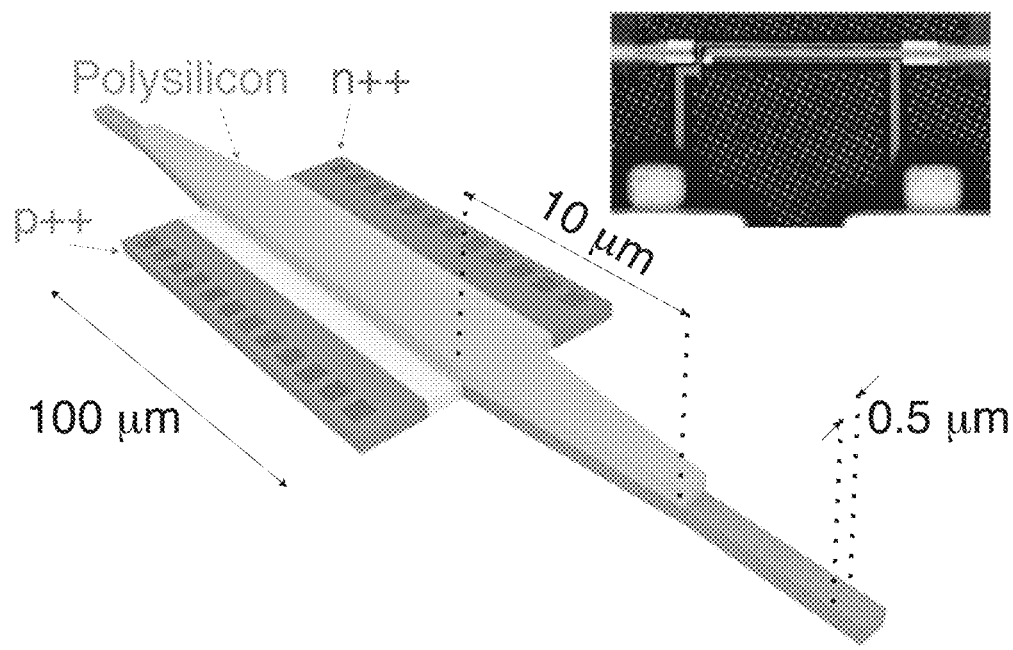
FIG. 2F shows the structure of the implemented p-doped-intrinsic-n-doped (PIN) phase modulator (See also FIG. 9).
Figure 2G:
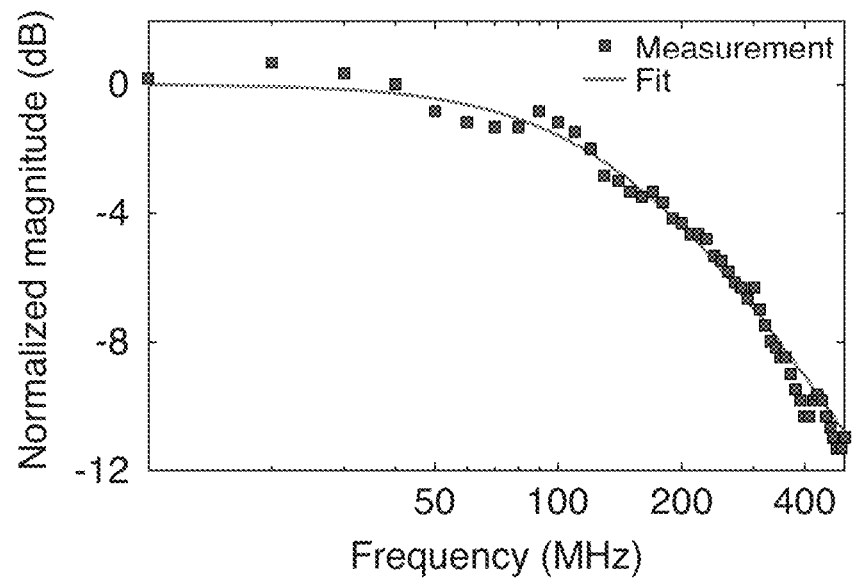
FIG. 2G shows the frequency response of the PIN phase modulator where a 3-dB bandwidth of 150 MHz is estimated.
Figure 2H:
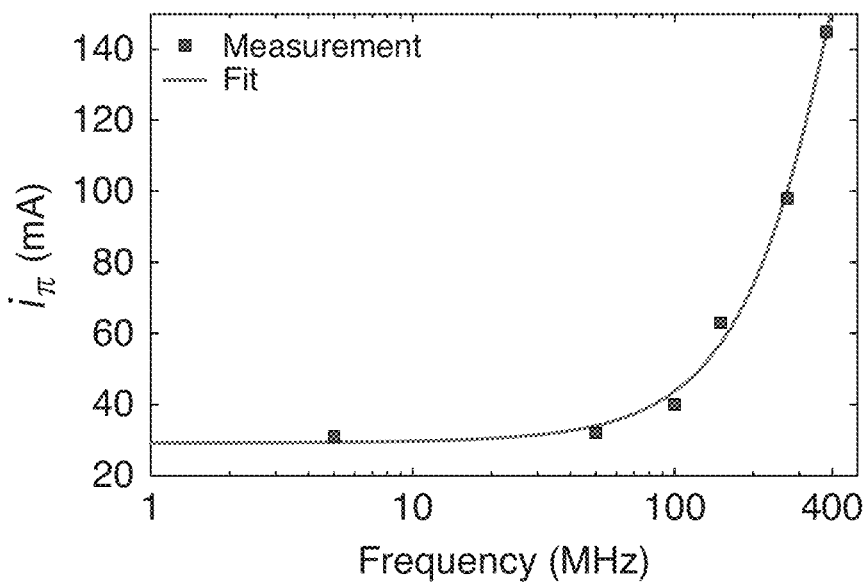
FIG. 2H The modulator $i_\pi$ versus frequency. At each frequency point, the modulator $i_\pi$ was measured by gradually increasing the modulator current and monitoring the modulator output optical power (Supplementary Note 2). An $i_\pi$ of about 64 mA at 150 MHz is estimated.
Figure 2I:
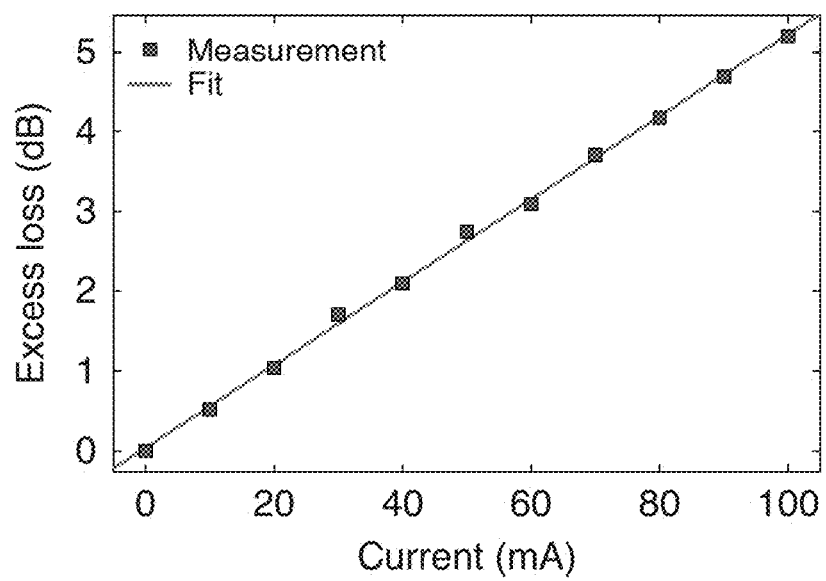
FIG. 2I shows the excess loss of the PIN modulator versus electrical current injected into the PIN device. The unbiased PIN phase modulator has a measured insertion loss of 5.8 dB. Error bars represent the standard deviations of the measured data for 8 chips fabricated in two different GF7RFSOI runs.

FIG. 2F shows the structure of the implemented PIN phase modulator. The electro-optical frequency response of the PIN modulator is shown in FIG. 2G where a 3-dB bandwidth of about 150 MHz was measured. The current required to generate a $\pi$ radians optical phase shift across the PIN modulator, $i_\pi$, was measured at different frequencies, which is depicted in FIG. 2H. The modulator $i_\pi$ measurement details are included in Supplementary Note 2. The implemented PIN modulator can also be used as a current-controlled attenuator. FIG. 2I shows the excess loss of the PIN modulator versus input DC current where an average attenuation of 0.05 dB/mA was measured. More details on PIN modulator/attenuator measurements are included in Supplementary Note 2. Despite successful implementation of several active and passive photonic devices on the GF7RFSOI process, a wideband photodiode with high responsivity was not implemented as no material with efficient absorption coefficient in the 1550 nm range is available in this standard electronic process.

The Electronically Reconfigurable MZI

Figure 3A:
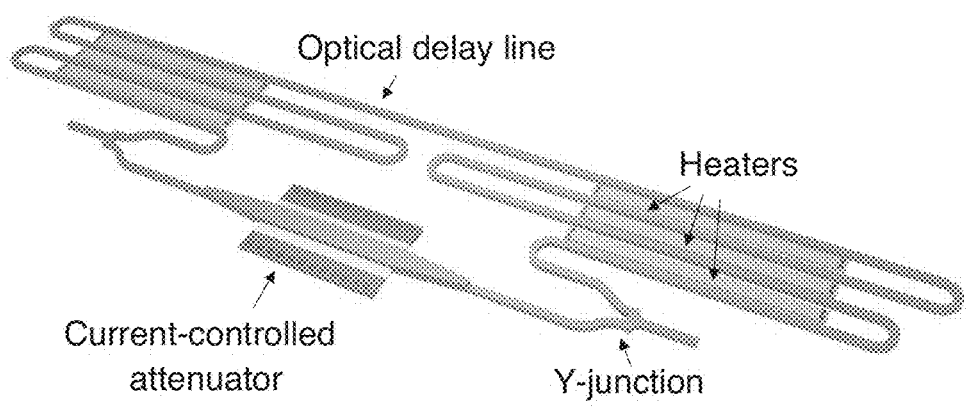
FIG. 3A shows the structure of the implemented reconfigurable Mach-Zehnder interferometer (MZI). The delay difference between the two arms is about 80 ps. The loss mismatch can be compensated using the p-doped-intrinsic-n-doped structure acting as a current-controlled attenuator. The relative phase between the two arms can be adjusted using p-type polysilicon heaters placed between the waveguides of the delay line.

FIG. 3A shows the structure of the implemented electronically reconfigurable MZI serving as the frequency reference for the reported integrated PDH system. Two Y-junctions are used as the splitter and combiner at the input and output of the MZI, respectively. An optical delay line, which is implemented using 500 nm wide waveguides, is placed in the top arm of the MZI. The phase difference between the two arms of the MZI can be adjusted using p-type polysilicon heaters placed between the waveguides of the delay line. The phase difference between the two arms and the loss of the bottom arm can be adjusted independently to maximize the extinction ratio.

Figure 3B:
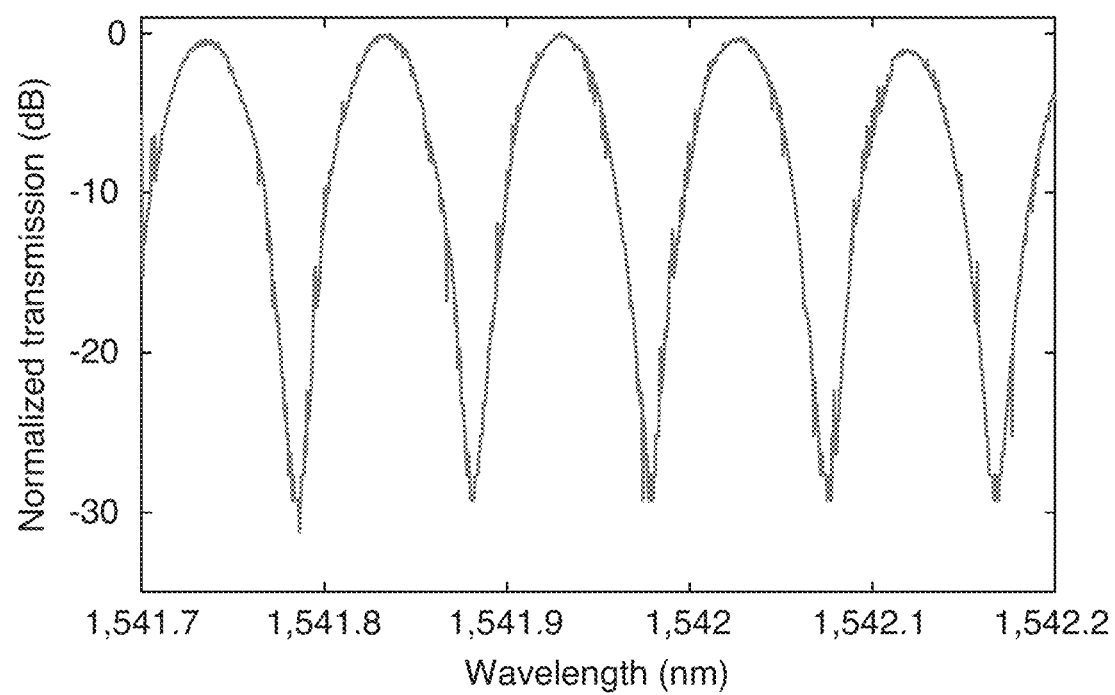
FIG. 3B shows the measured transmission spectrum of the integrated MZI. The free spectral range of 0.1 nm and an extinction ratio of 28 dB were measured. The measurement details and the characterization setup are included in Supplementary Note 3 and FIG. 11, respectively.

FIG. 3B shows the measured response of the MZI. The measured free spectral range (FSR) of 0.1 nm corresponds to an 80 ps delay difference between the arms. By minimizing the loss mismatch between the two arms using the current-controlled attenuator and adjusting the relative phase between the two arms using the heaters, an extinction ratio of more than 28 dB was measured. The measurement details are included in Supplementary Note 3.

The PDH Open-Loop Readout Signal

Figure 4A:
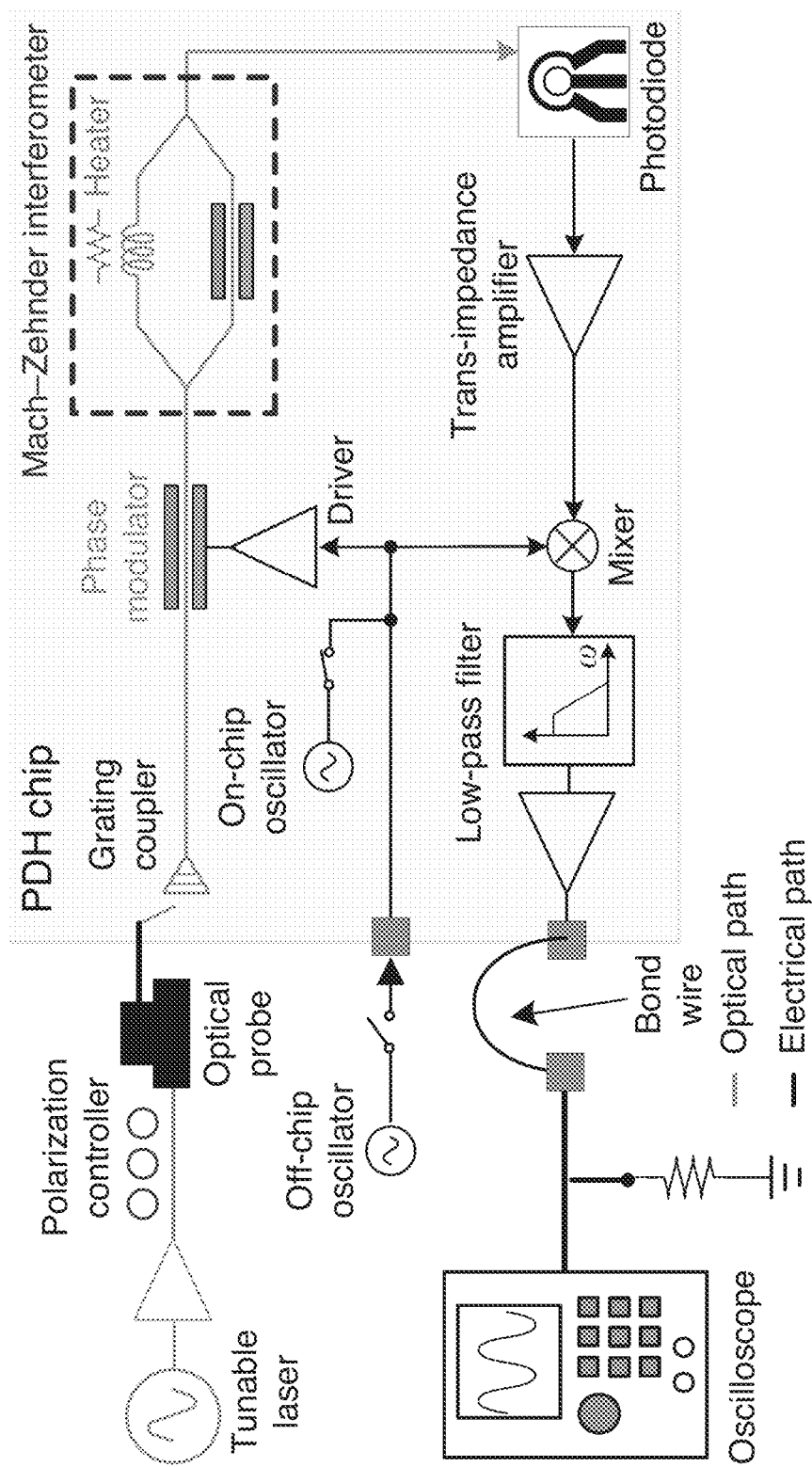
FIG. 4A shows a block diagram of the Pound-Drever-Hall (PDH) open-loop measurement setup. An optical probe is used to couple the amplified output of an Agilent 81642A laser into the PDH chip. The output current of the voltage-to-current converter is used to drive a load emulating the impedance of the laser gain section and is monitored using an oscilloscope.
Figure 4B:
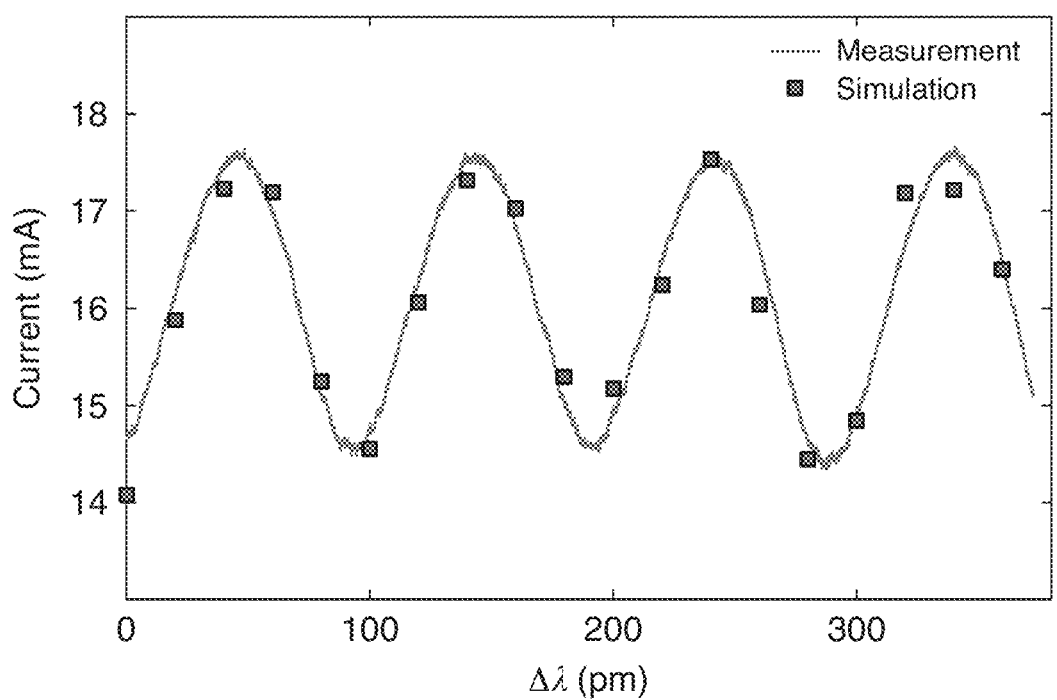
FIG. 4B shows a simulated open-loop PDH read-out current (at $A_i$=82 dB) is shown which follows a sinusoidal form as predicted by equation (1). The measured PDH open-loop read-out signal is also shown which is in close agreement with the simulation for the same operating point setting.

To calculate the open-loop read-out signal at the output of the VtoI, the loop in FIG. 1A is disconnected after the VtoI. In this case, as discussed in Supplementary Note 1, the PDH read-out signal is calculated as $$i_{out}=K_{OE} \sin(\omega_0 \tau + \phi), \quad (1)$$

where $\omega_0$, $\tau$ and $\phi$ are the laser frequency, the delay difference between the arms of the reconfigurable MZI and the relative phase between the two arms, respectively. Also, the amplitude of the PDH read-out signal, $K_{OE}$, depends on the optical and electrical settings and parameters and is defined in Supplementary Equation (11). The electronic current gain, $$A_i = 20\log\left(\frac{i_{out}}{i_{PD}}\right),$$

is defined as the ratio of the VtoI output current to the photodiode photo-current. This current gain can be adjusted between 52 dB to 112 dB. The measured performance of the photonic test structures were used to implement VerilogA models which together with the available scalable models of the electronic devices can be used for system simulations using Cadence tools[27]. FIG. 4A shows the block diagram of the open-loop measurement setup. An optical probe is used to couple the amplified output of an Agilent 81642A tunable laser into the chip through a grating coupler. The output current of the VtoI is used to drive a load emulating the impedance of the laser gain section and is monitored using an oscilloscope. The measured read-out signal is compared with the simulated open-loop read-out signal in FIG. 4B. As predicted by equation (1), when the wavelength of the tunable laser is swept, a sinusoidal waveform appears on the oscilloscope which is in agreement with the simulation for the same operating point.

The PDH Closed-Loop Operation and Frequency Noise Reduction

Consider the case that the laser frequency is perturbed around its steady state. When this small perturbation is applied to the proposed PDH system, it causes the PDH read-out signal to deviate from its steady state. In this case, equation (1) is modified to $$i_{out,ss}+\delta i_{out}=K_{OE}\times\sin[(\omega_{0,ss}+\delta\omega)\tau+\phi], \quad (2)$$

where $\omega_{0,ss}$, $\delta\omega$, $i_{out,ss}$ and $\delta i_{out}$ are the steady state laser frequency, the frequency perturbation, the steady state output current and the output current change due to frequency perturbation, respectively. Since perturbation is by definition small, $\sin(\delta\omega)\approx\delta\omega$ and $\cos(\delta\omega)\approx 1$ can be considered. Therefore, equation (2) is simplified to $$\delta i_{out}\approx K_{OE}\cos(\omega_{0,ss}\tau+\phi)\delta\omega\tau. \quad (3)$$

Using equation (1) at steady state, equation (3) results in $$\frac{\delta i_{out}}{\delta\omega}\approx\tau K_{OE}, \quad (4)$$

where $$\frac{\delta i_{out}}{\delta\omega}$$

is the PDH small signal frequency to output current conversion gain, and $i_{out,ss}\ll K_{OE}$ is assumed.

A semiconductor laser can be modelled as a current-controlled oscillator. In this case, the instantaneous frequency of the laser is written as $$\omega(t)=\omega_0+K_L i_{ctrl}(t)+\omega_n(t), \quad (5)$$

where $\omega_0$, $K_L$, $i_{ctrl}(t)$ and $\omega_n(t)$ are the lasing frequency, the laser gain, the control current injected to the gain section of the laser and the laser intrinsic frequency noise, respectively. By perturbing $i_{ctrl}(t)$ around its steady state in equation (5), the laser small signal current to frequency conversion gain is calculated as $$\frac{\delta\omega_0}{\delta i_{ctrl}}=K_L, \quad (6)$$

where $\delta i_{ctrl}$ and $\delta\omega_0$ are the laser control current perturbation and the frequency change due to the current perturbation, respectively. Once the loop is closed, the VtoI output current, the read-out signal, is injected to the laser (as the laser control current).

Figure 5:
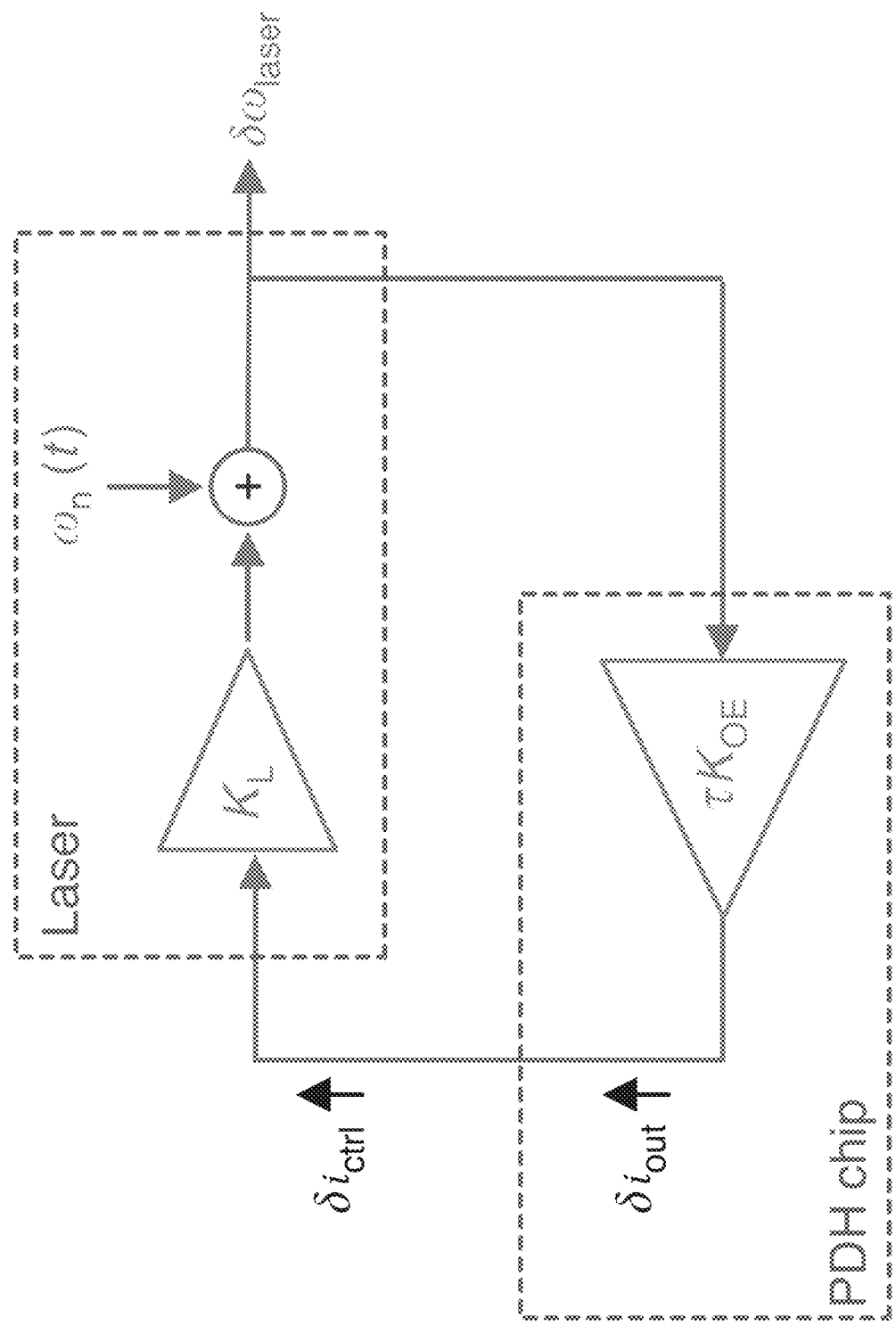
FIG. 5 illustrates a linearized Pound-Drever-Hall system. The block diagram of the linearized Pound-Drever-Hall (PDH) system is shown where the laser and the PDH system are linearized around the operating point. When the loop is open, the total laser frequency noise, $\delta\omega_{laser}$, is equal to the laser intrinsic frequency noise, $\omega_n(t)$. When the loop is closed, the PDH chip output current, $\delta i_{out}$, would be the same as the laser control current, $\delta i_{ctrl}$. In this case, the laser frequency noise is reduced by the loop gain, where the loop gain is defined as the product of the PDH small signal frequency to output current conversion gain, $\tau K_{OE}$, and the laser small signal current to frequency conversion gain, $K_L$.

FIG. 5 shows the simplified linearized block diagram of the reported integrated PDH system. When the loop is disconnected after the VtoI, the total frequency noise at the laser output, $\delta\omega_{laser}$, is equal to $\omega_n(t)$. When the loop is closed, the total laser frequency noise is reduced by the loop gain as $$\delta\omega_{laser}=\frac{\omega_n(t)}{1+K_{Loop}}, \quad (7)$$

where the loop gain is defined as $K_{Loop}=|\tau K_{OE}K_L|$.

Note that according to Supplementary Equation (11), $K_{OE}$ and hence the loop gain depends on the electrical phase shift, $\theta$, which can be adjusted electronically in the modulator driver circuit. Also, the gain of all electronic blocks can be set independently to adjust the loop gain.

Figure 6A:
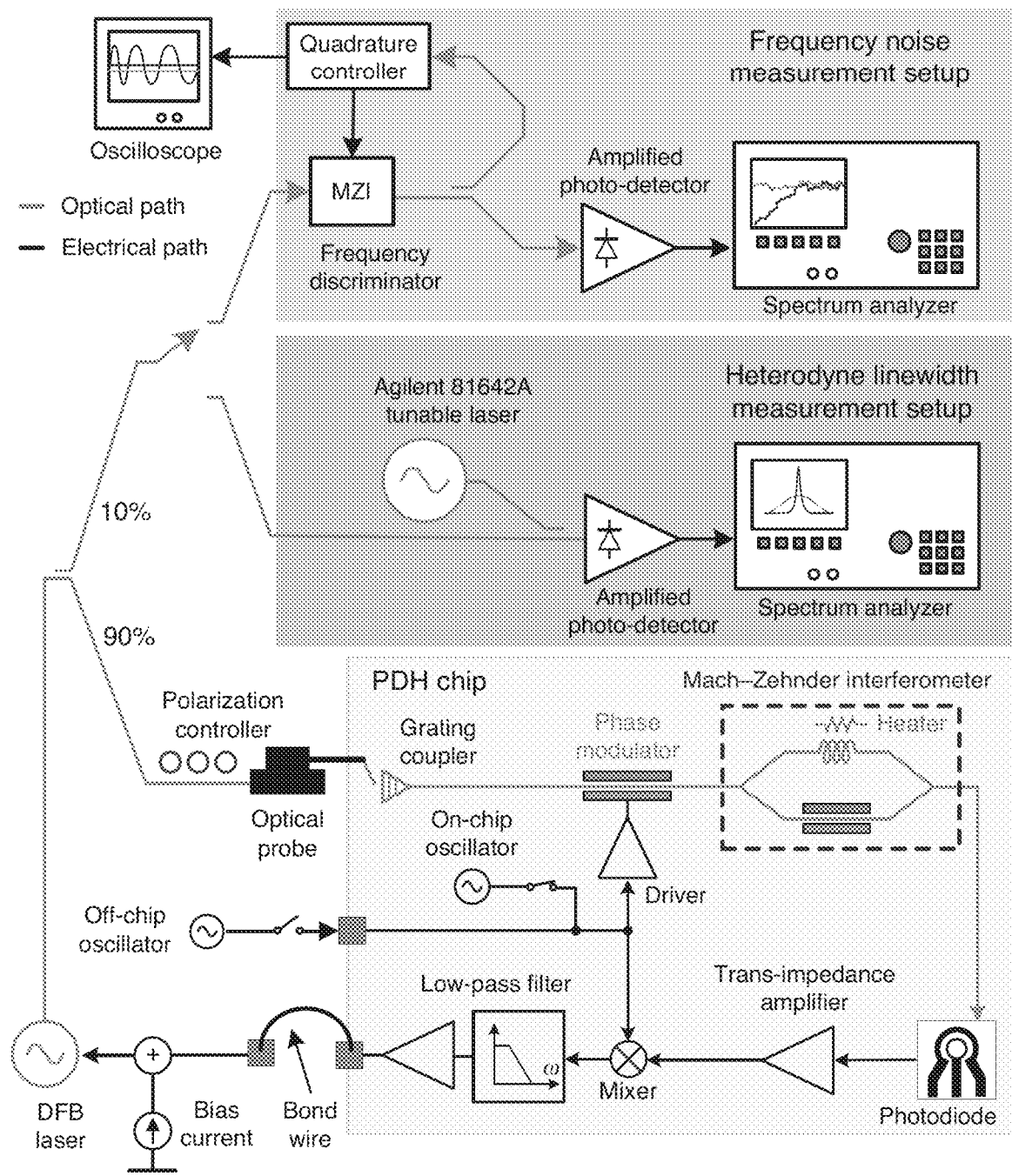
FIG. 6A shows a frequency noise and heterodyne linewidth measurement setups. For the frequency noise measurements, an optical fibre based Mach-Zehnder interferometer (MZI) is utilized as a frequency discriminator (Supplementary Note 4). To measure the heterodyne linewidth of the distributed feedback (DFB) laser before and after Pound-Drever-Hall (PDH) stabilization, the beat note between the DFB laser and an Agilent 81642A tunable laser is monitored on an electrical spectrum analyzer.

Using open-loop simulations for $A_i=112$ dB, $K_{Loop}\approx 18.8$ was estimated which corresponds to a 25.9 dB frequency noise suppression. FIG. 6A shows the experimental setup that was used for frequency noise and heterodyne linewidth measurements. The output of an Alcatel 3CN00325CW distributed feedback (DFB) laser is split into two branches using a 90/10 fusion coupler. In the bottom branch, 90% of the laser output power is coupled into the reported PDH chip after polarization adjustment. In the top branch, 10% of the laser power is used for frequency noise and linewidth monitoring. For the frequency noise measurements, an optical fibre based MZI acting as a frequency discriminator is used (see Supplementary Note 4 for more details). FIG. 6A also shows the heterodyne linewidth measurement setup where the beat note between the DFB laser and an Agilent 81642A tunable laser is monitored on an Agilent 8563E spectrum analyzer. The full-width at half-maximum (FWHM) linewidth of 25 kHz is measured for the Agilent 81642A tunable laser which is used to estimate the linewidth of the DFB laser in the heterodyne setup.

Figure 6B:
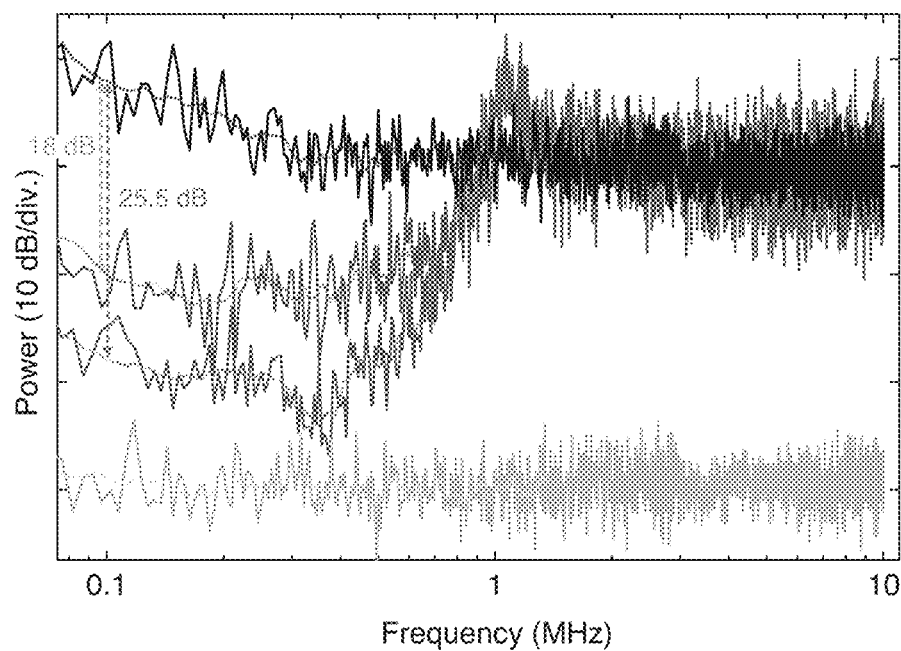
FIG. 6B shows frequency noise measurement. The measured closed loop response of the reported PDH system is shown where the original frequency noise of the laser (black) is reduced by more than 25 dB (for $A_i$=112 dB) when an off-chip 150 MHz oscillator is used (red) and by more than 18 dB when the on-chip 280 MHz oscillator is used (blue). The noise floor of the measurement setup is shown in yellow.

FIG. 6B shows the measured frequency noise of the DFB laser before and after PDH stabilization. Under the closed-loop condition, the original frequency noise of the DFB laser is reduced by more than 25 dB when the off-chip oscillator (at 150 MHz) is used and by more than 18 dB when the on-chip oscillator (at 280 MHz) is used. Note that while the frequency of the off-chip oscillator can be set to 150 MHz, the frequency of the on-chip oscillator cannot be set below 280 MHz as the oscillator parasitic capacitors were overestimated during the on-chip oscillator design. Based on FIG. 2G, changing the LO frequency from 150 MHz to 280 MHz results in over two times loop gain reduction which is approximately consistent with 7 dB lower frequency noise suppression. The frequency of the on-chip oscillator can be lowered to 150 MHz by increasing the capacitance of the on-chip oscillator at no power consumption penalty.

Figure 6C:
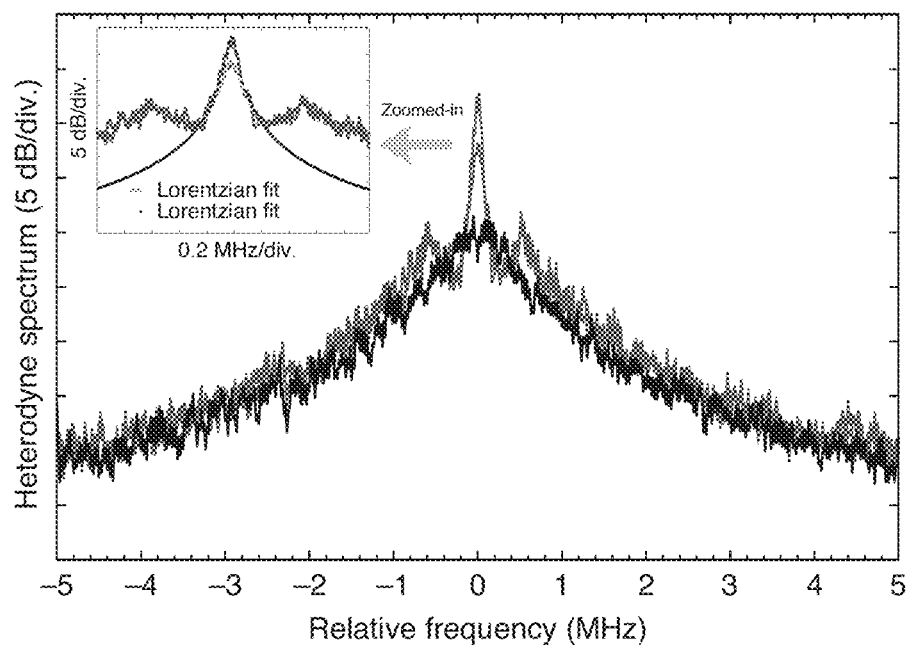
FIG. 6C shows a full-width at half-maximum (FWHM) linewidth measurement. The beat note between the DFB laser and an Agilent 81642A tunable laser is monitored on an Agilent 8563E electrical spectrum analyzer. Under the closed-loop condition, the linewidth of the free-running laser (black) is reduced using on-chip oscillator (blue) and off-chip oscillator (red). The inset shows the zoomed-in heterodyne spectra with Lorentzian fits.

The measured heterodyne spectrum of the DFB laser before and after frequency noise reduction is shown in FIG. 6C where the free-running FWHM linewidth of the DFB laser emitting 12 dBm at 194.68 THz was reduced from 750 kHz to 55 kHz when the off-chip oscillator was used and to 95 kHz when the on-chip oscillator was used. The resolution bandwidth for these measurements was set to 10 kHz. The zoomed-in heterodyne spectra with Lorentzian fits are illustrated in the inset of FIG. 6C.

We have calculated the approximate linewidth reduction of the DFB laser using the measured frequency noise spectra for free-running and closed-loop cases in FIG. 6B. The calculated linewidth reduction for the on-chip and off-chip oscillator cases are 11.9 dB and 9.8 dB, respectively, which is in agreement with the measurement results shown in FIG. 6C.

Figure 7A:
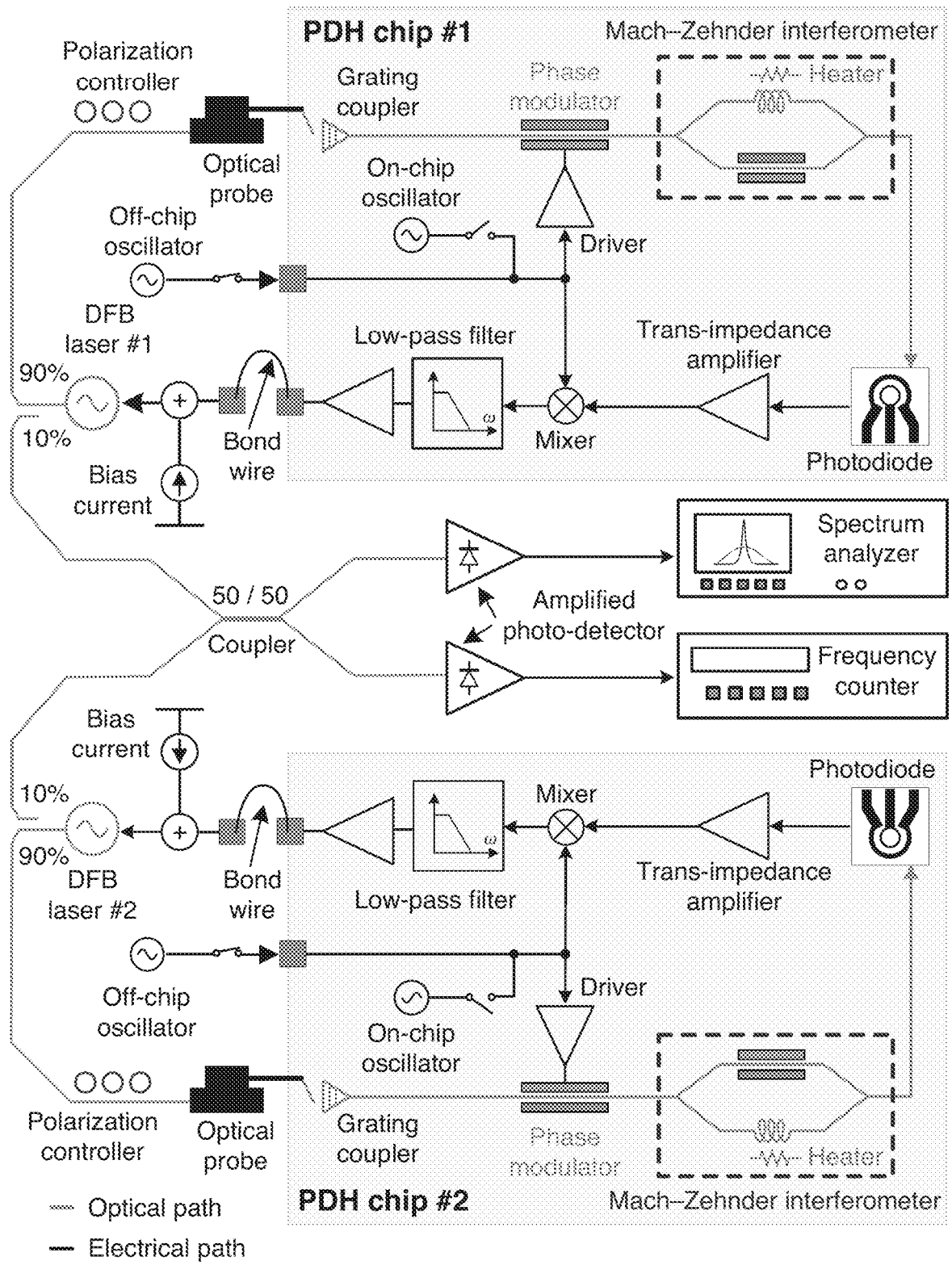
FIG. 7A shows the Allan deviation measurement setup. Two Alcatel 3CN00325CW distributed feedback (DFB) lasers were independently Pound-Drever-Hall (PDH) stabilized using two PDH chips. The outputs of two stabilized lasers were combined using a 50/50 coupler and photo-detected. The photo-current was amplified and used to measure the relative Allan deviation and the spectrum of the beat note.
Figure 7B:
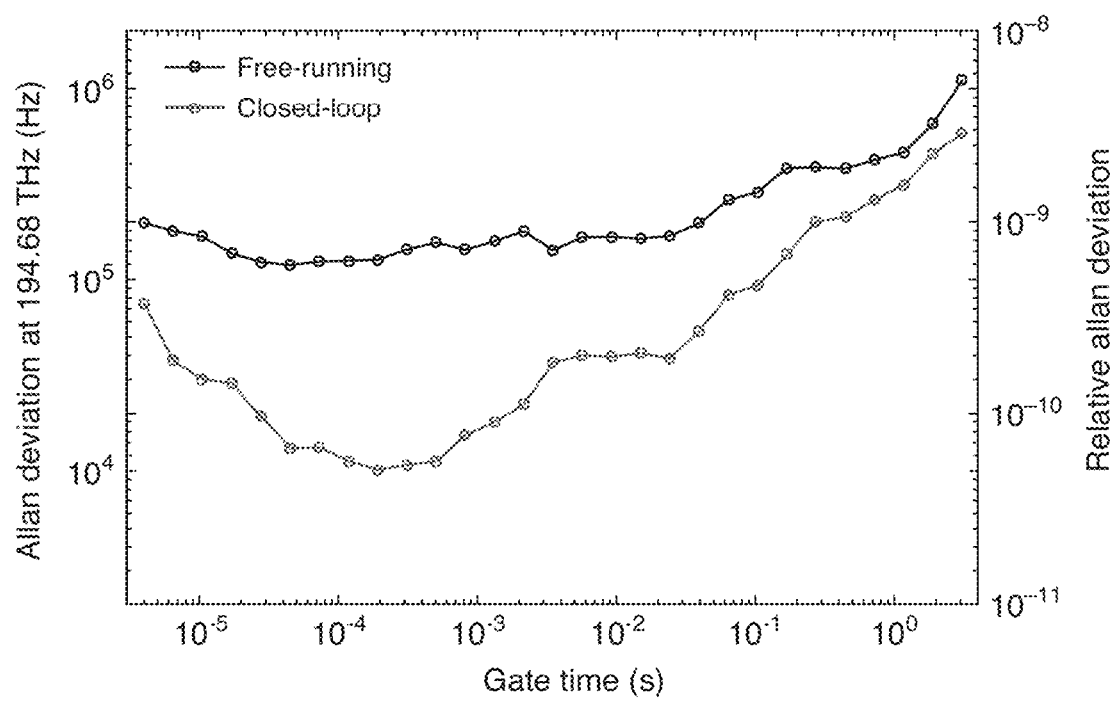
FIG. 7B shows a measured relative Allan deviation of the beat note between two DFB lasers is shown for free-running and independently PDH stabilized cases. At a gate time of 200 μs, the relative Allan deviation of the beat note is decreased from $6.5 \times 10^{-10}$ to $5.2 \times 10^{-11}$ when the PDH stabilization was engaged. In this case, assuming the two DFB lasers are equivalent, a relative Allan deviation reduction from $4.6 \times 10^{-10}$ to $3.6 \times 10^{-11}$ is estimated for each PDH stabilized laser.
Figure 7C:
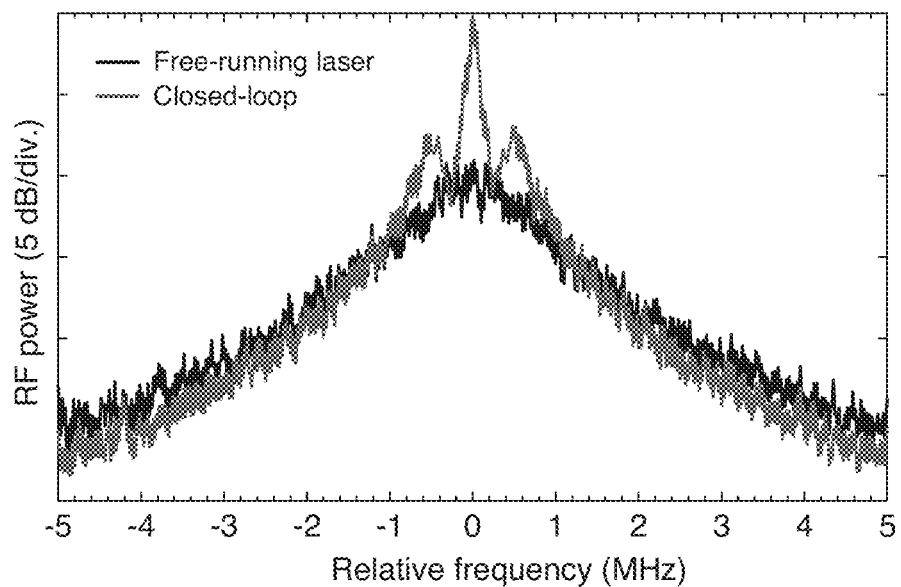
FIG. 7C shows a radio frequency (RF) spectrum of the beat note between two DFB lasers for free-running and closed-loop cases.

To measure the frequency stability of the PDH stabilized laser, two CMOS chips were used to perform Allan deviation measurements in the setup depicted in FIG. 7A. Two Alcatel 3CN00325CW DFB lasers emitting 12 dBm at 194.68 THz were independently PDH stabilized using two CMOS chips. The outputs of two stabilized lasers were combined using a 50/50 coupler. Two output branches of the 50/50 coupler were photo-detected separately. The top branch was used to monitor the radio frequency (RF) power spectrum of the beat note between two DFB lasers and the bottom branch was used to measure the Allan deviation using a Tektronix FCA3120 RF frequency counter. FIG. 7B shows the relative Allan deviation of the beat note measured over the range of gate times from 4 μs to 3 s before and after engaging the integrated PDH systems. Relative Allan deviation smaller than $10^{-10}$ was measured from 40 μs to 1 ms which is more than 10 times lower than that of the free-running case. Assuming two DFB lasers are independent and equivalent, the relative Allan deviation for each stabilized DFB laser over this range of gate times is lower than $5.5 \times 10^{-11}$ (with a minimum of $3.6 \times 10^{-11}$ occurring at 200 μs, corresponding to more than 12 times Allan deviation reduction). FIG. 7C shows the RF spectrum of the beat note between two DFB lasers for both free-running and closed-loop cases where linewidth reduction is apparent. The resolution bandwidth for these measurements was set to 10 kHz resulting in a 50 ms sweep time for a frequency span of 10 MHz. Under the closed-loop condition, we have estimated the FWHM linewidth of 100 kHz for the beat note which, assuming equivalent and independent DFB lasers, corresponds to a FWHM linewidth of 50 kHz for each stabilized DFB laser which is in close agreement with the heterodyne linewidth measurements shown in FIG. 6C.

Discussion

Ideally, the integrated PDH system should be able to perform a large frequency noise reduction over a wide bandwidth. However, undesired effects such as noise of electronic and photonic devices and the laser frequency modulation (FM) response limit the PDH stabilization performance. As discussed in the Supplementary Note 7, while the system noise including the noise of electronic devices, the relative intensity noise of the laser and the photodiode shot noise are suppressed by the loop gain, the residual system noise is injected to the laser increasing its frequency noise. Therefore, reducing the system noise would improve the PDH stabilization performance. Another undesired effect is the FM response of the semiconductor laser which limits the frequency noise reduction bandwidth. The thermal and the charge carrier effects modulate the refractive index of the gain medium in opposite directions. As a result, an abrupt phase change occurs in the laser FM response (at about 0.9 MHz for the Alcatel 3CN00325CW DFB laser) that can cause loop instability for a large enough loop gain. This effectively limits the loop gain-bandwidth product. A lead-lag filter may be added to the PDH loop to improve the system phase margin allowing for a higher frequency noise reduction bandwidth at the same (or higher) loop gain.

In conclusion, we have demonstrated an integrated PDH system implemented on a 180 nm standard CMOS process with no post-processing. In the proposed architecture, an electronically reconfigurable MZI is introduced serving as the frequency reference making the reported PDH system less sensitive to fabrication process variations. The implemented PDH system was used to suppress the frequency noise of a commercially available semiconductor lasers by more than 25 dB, its FWHM linewidth by more than 13 times, and its relative Allan deviation by more than 12 times (at a 200 μs averaging time) while occupying a 2.38 mm² area. The integrated PDH system can be used to significantly improve the noise performance and stability of a low-cost laser chip enabling realization of inexpensive highly stable compact light sources with many applications in science and engineering such as communication, sensing and metrology, to name a few.

CMOS Chip Implementation

Figure 13:
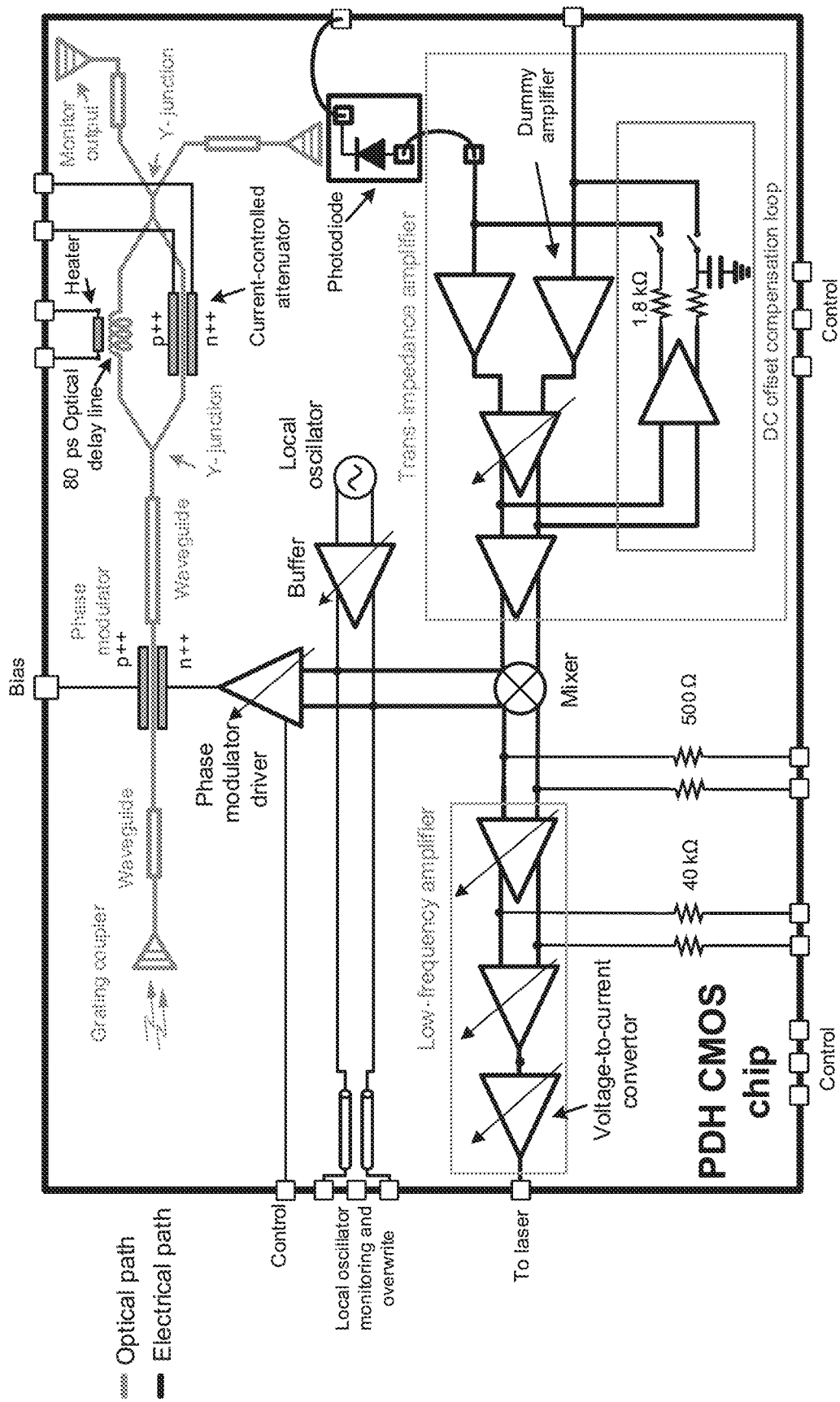
FIG. 13 illustrates a block diagram of the Pound-Drever-Hall chip. All electronic and photonic devices and blocks are monolithically integrated on the GF7RFSOI 180 nm complementary metal-oxide semiconductor (CMOS) silicon-on-insulator (SOI) chip except for the photodiode which is hybrid integrated with the CMOS chip.

The detailed block diagram of the CMOS chip is shown in FIG. 13. All electronic and photonic devices except for the vertical InGaAs photodiode are monolithically integrated on the GlobalFoundries GF7RFSOI, a standard 180 nm CMOS SOI process, with no post-processing. The implemented photonic devices include the input grating coupler, a PIN phase modulator, nanophotonic waveguides, and the reconfigurable MZI. The MZI output is photo-detected using a photodiode chip placed on top of the grating coupler. The photo-current is amplified and converted to a voltage using a multi-stage TIA. The TIA output is mixed with the LO signal using a double-balanced mixer. The LO signal is generated on-chip by a voltage-controlled ring oscillator and can be overwritten by an off-chip oscillator. The mixer output is amplified and low-pass filtered and converted to a current using a voltage-to-current converter. The CMOS chip details are presented in Supplementary Note 5 and the schematics of core electronic blocks are shown in FIG. 14A-FIG. 4G. The hybrid integration of the photodiode chip with the CMOS chip is discussed in Supplementary Note 8.

CMOS Electronic Block Characterization and Electrical and Optical Noise Sources.

The measured performance of the CMOS electronic blocks is summarized in Supplementary Note 6 and Supplementary Table 1. The noise sources and their effects are discussed in Supplementary Note 7. A list of all measurement equipment and components are provided in Supplementary Table 2.

Supplementary Examples and Notes:

Supplementary Table 1|the Performance of the On-Chip Core Electronic Blocks

The performance of electronic blocks are summarized in this table.

| Block | Performance |
| --- | --- |
| Trans-impedance amplifier (TIA) | Gain: −10 to 85 dBΩ, Bandwidth: 1.55 GHz |
| Mixer | Conversion gain: −7 to 18 dB*, Bandwidth: 12.5 GHz* |
| Base-band amplifiers | Gain: 10 to 55 dB* |
| Oscillator | Phase noise: −116 dBc/Hz @1 MHz*, tunability: 280 MHz-3 GHz |
| Voltage-to-current convertor | Gain: 0 to 8 mA/V |
| Total power consumption | 237 mW |

Supplementary Table 2|List of Equipment and Components Used in Different Experimental Setups The list of all equipment and components used for characterizations and measurements is provided.

| Equipment | Model |
| --- | --- |
| RF signal generators | Agilent E4433B, Gigatronics 2520A |
| RF spectrum analyser | Agilent 8563E |
| Tunable laser | Agilent 81642A |
| Power supply | Keysight E3631A, Agilent 3620A |
| Laser current source | LDX 3620 |
| Laser temperature controller | LDT 5412 |
| Photodiode | Thorlabs PDB460C, MOS42AM, GT40-7002RX |
| Oscilloscope | Hantek DSO5102P |
| 180° Hybrid | Minicircuits ZFSCJ-2-4-S+ |
| Intensity modulator | UTP SN-135252A |
| Erbium-doped fibre amplifier (EDFA) | KPS-OEM-C-19-WDM-Sd-D-FA/02 |
| Optical spectrum analyser | AQ6331 |
| Wide-band laser source | Thorlabs fibre coupled SLD source |
| Bias tee | Picosecond Pulse labs |
| RF amplifier | Minicircuits ZX60-33LN-S+ |
| Frequency counter | Tektronix FCA3120 |
| Digital voltmeter | HP 3478A |
| Optical modulator driver | JDS Uniphaase H301 |

Supplementary Note 1: The PDH Read-Out Signal

Figure 8A:
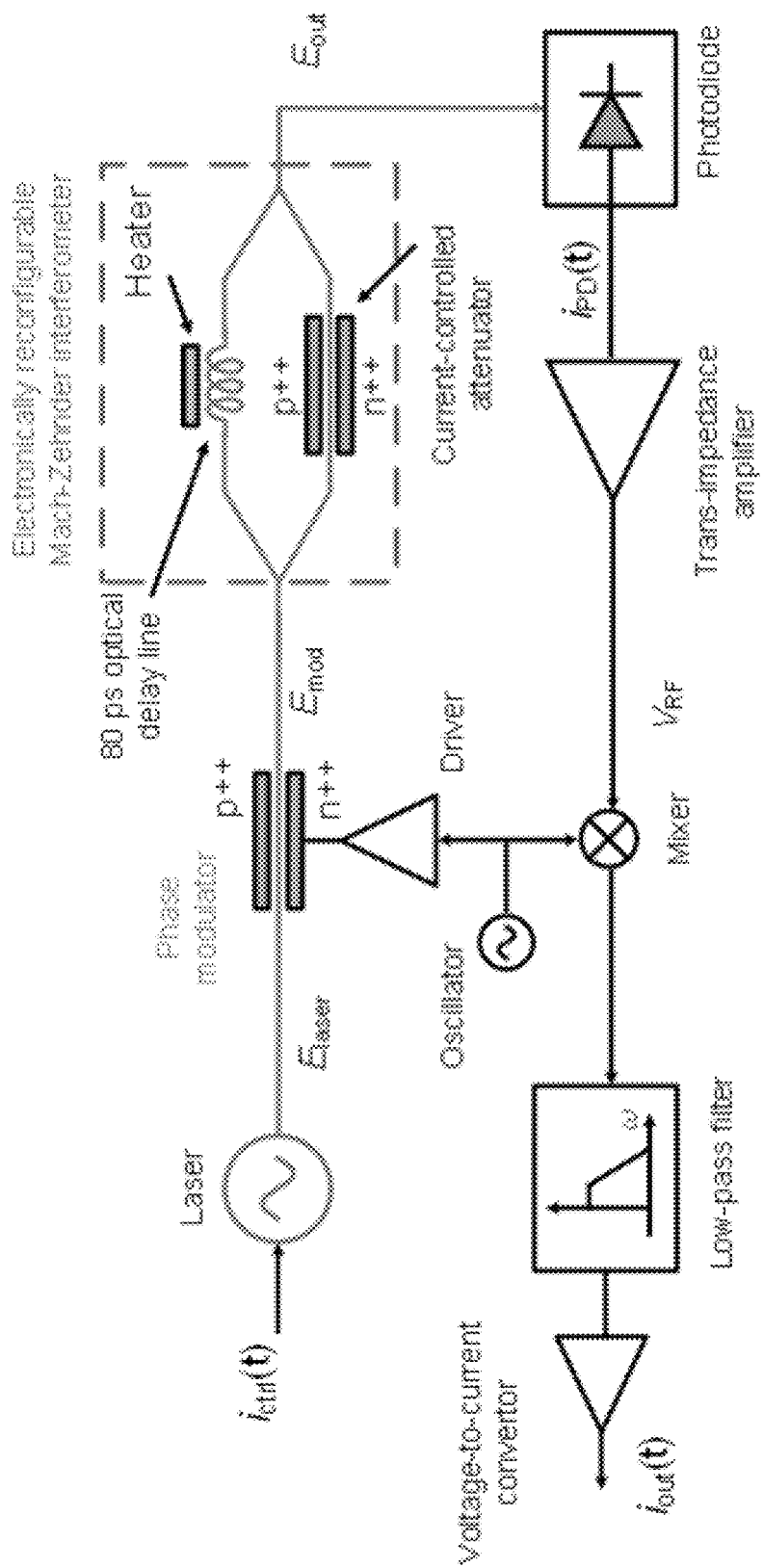
FIG. 8A shows the block diagram of the pound-drever-hall (PDH) system under the open-loop condition. A small signal current, $i_{ctrl}(t)$, is applied to the laser, changing the phase and frequency of the laser electric field. The laser output electric field, $E_{laser}$, is phase modulated and the modulated signal, $E_{mod}$, passes through the electronically reconfigurable Mach-Zehnder interferometer (MZI). The MZI output, $E_{out}$, is photo-detected. The photo-current, $i_{PD}(t)$, is amplified and converted to a current using a trans-impedance amplifier (TIA). The TIA output, $V_{RF}$, is mixed with the oscillator output (which is also used to phase modulate the laser output electric field) and low-pass filtered. The filter output voltage is converted to the PDH read-out current, $i_{out}(t)$, using a voltage-to-current converter.

The block diagram of the reported Pound-Drever-Hall (PDH) system under the open-loop condition is shown in FIG. 8A where the PDH read-out signal is defined as the voltage-to-current convertor (VtoI) output current, $i_{out}(t)$. Consider the case that the electric field of the laser output is written as $$E_{laser}(t) = \sqrt{P_0} \cos(\omega_0 t), \quad (1)$$

where $P_0$ and $\omega_0$ are the laser power and frequency, respectively. Also, assume the electrical oscillator output voltage can be written as $$v_{osc}(t) = a_o \sin(\Omega t), \quad (2)$$

where $a_o$ and $\Omega$ are the oscillation amplitude and frequency, respectively. The phase modulator (PM) driver increases the level of the oscillator output to $v_0$ and introduces a phase shift, $\theta$, between its input and output. In this case, the modulator driver output is written as $$v_{PM,driver}(t) = v_0 \sin(\Omega t + \theta). \quad (3)$$

The modulation index can be defined as $$\beta = \frac{\left(\frac{v_0}{Z_{in,mod}}\right)}{i_\pi} \pi, \quad (4)$$

where $i_\pi$ is the current required to generates a $\pi$ radians optical phase shift across the optical phase modulator and $Z_{in,mod}$ represents the input impedance of the phase modulator. In this case, the electric field at the output of the phase modulator is written as $$E_{mod}(t) = \sqrt{P_0} \cos[\omega_0 t + \beta \sin(\Omega t + \theta)]. \quad (5)$$

The modulated signal passes through the electronically reconfigurable Mach-Zehnder interferometer (MZI). The MZI output is photo-detected and the photo-current is written as $$i_{PD}(t) = \tfrac{1}{4}RP_0\alpha\{\cos[\omega_0(t-\tau)+\beta \sin(\Omega(t-\tau)+\theta)] + \cos[\omega_0 t+\phi+\beta \sin(\Omega t+\theta)]\}^2 \quad (6)$$

where R, $\alpha$, $\tau$ and $\phi$ are the photodiode responsivity, the total optical transmission, the delay difference between the two arms of the MZI and the relative phase between the two arms of the MZI, respectively. The photo-current can be simplified to $$i_{PD}(t) = \tfrac{1}{4}RP_0\alpha\{\cos(\omega_0\tau+\phi)\cos[Z\cos(\Omega t+\psi)] - \sin(\omega_0\tau+\phi)\sin[Z\cos(\Omega t+\psi)]\} + DC\ terms, \quad (7)$$

where $$Z = 2\beta\sin\left(\frac{\Omega\tau}{2}\right) \text{ and } \psi = \theta - \frac{\Omega\tau}{2}. \quad (8)$$

Using the Jacobi-Anger expansion[1], the photo-current is written as $$i_{PD}(t) = \tfrac{1}{2}RP_0\alpha\sin(\omega_0\tau+\phi)\sum_{n=1}^{\infty}\{(-1)^n J_{2n-1}(Z)\cos[(2n-1)(\Omega t+\psi)]\} + DC\ terms + terms\ at\ 2n\Omega, \quad (9)$$

where $J_{2n-1}(.)$ represent the Bessel functions of the first kind. The photo-current is converted to a voltage and amplified using a trans-impedance amplifier (TIA) and mixed with $v_{osc}(t)$. The mixer output is low-pass filtered (to remove higher order terms), amplified and converted to a current using a VtoI. In this case, the output current of the VtoI, the read-out signal, can be written as $$i_{out}(t) = K_{OE}\times\sin(\omega_0\tau+\phi), \quad (10)$$

where $K_{OE}$ is calculated as $$K_{OE} = \frac{1}{2}RP_0\alpha J_1(\beta\Omega\tau)\sin\left(\theta - \frac{\Omega\tau}{2}\right)A_i. \quad (11)$$

In Supplementary Equation (11), $$A_i = \frac{i_{out}}{i_{PD}} = G_{TIA}G_{Mixer}G_{VtoI}$$

represents the total electrical current gain which is defined as the ratio of the VtoI output current to the photo-current. Also, $G_{TIA}$, $G_{Mixer}$ and $G_{VtoI}$ are the TIA trans-impedance gain, the mixer conversion gain and the VtoI trans-conductance gain, respectively. Note that since the on-chip delay $\tau$ is much smaller than $\Omega^{-1}$, in the derivation of Supplementary Equation (11), it is assumed that $$2\beta\sin\left(\frac{\Omega\tau}{2}\right) \approx \beta\Omega\tau.$$

Figure 8B:
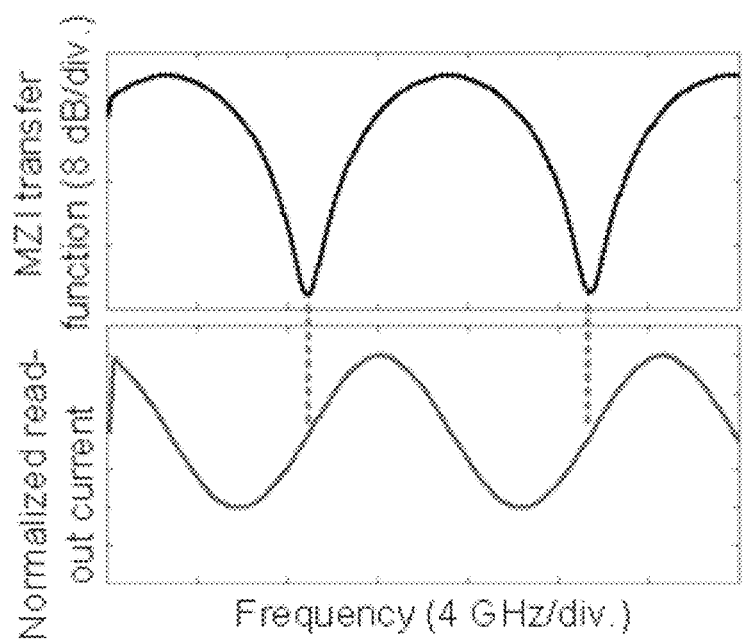
FIG. 8B shows the simulated magnitude response of the MZI transfer function (black) and the simulated normalized read-out current (purpel). The read-out current is asymmetric around the notch frequency in the MZI transfer function.

FIG. 8B shows the simulated read-out signal and the simulated MZI transfer function. As shown, the read-out signal is asymmetric with respect to the frequency of the notch in the MZI frequency response, $f_{notch}$. Therefore, the read-out signal indicates both the difference between the laser frequency and $f_{notch}$ and whether the laser frequency is greater or less than $f_{notch}$. Thus, by injecting the read-out signal to the laser, the laser frequency can be locked to the frequency of the notch in the MZI.

Supplementary Note 2: Characterization of the Integrated Phase Modulator

Figure 9:
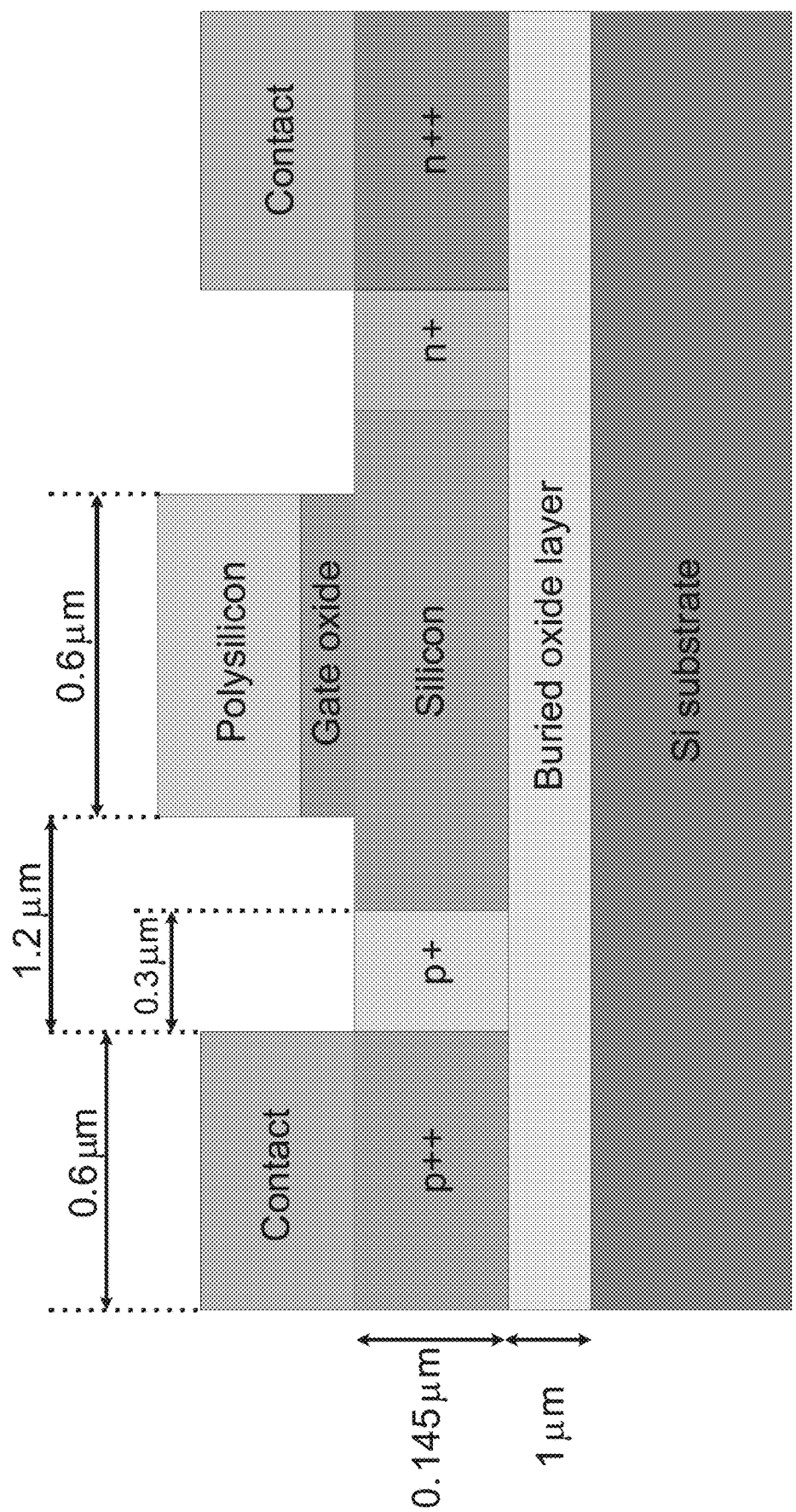
FIG. 9 illustrates a cross-section of the implemented phase modulator. The optical mode is confined in the poly-silicon and silicon (Si) regions. Moderately doped silicon regions (p+ and n+) are used to form the junction and heavily doped regions (p++ and n++) are used under the electrical contacts. The refractive index of the silicon waveguide (between p+ and n+ regions) changes through carrier injection modulating the phase of the optical wave.
Figure 10A:
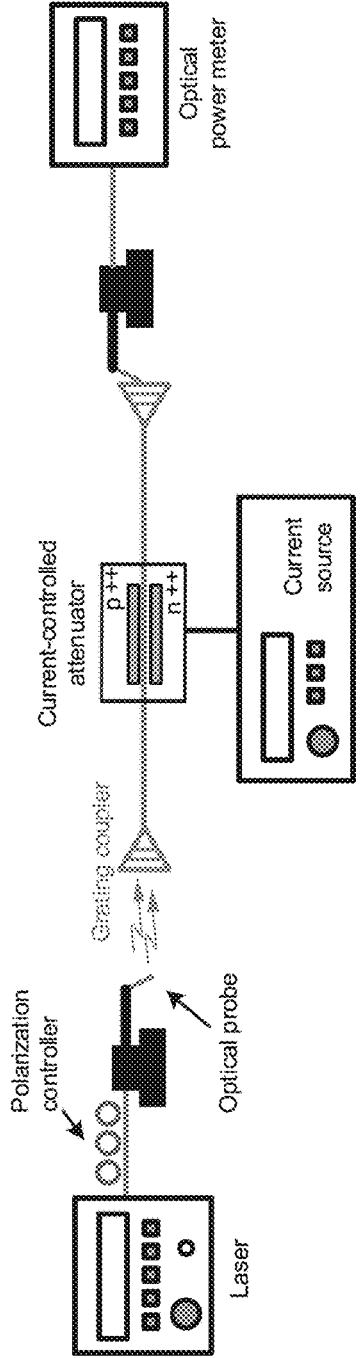
FIG. 10A shows a setup for characterization of the p-doped-intrinsic-n-doped (PIN) structure as a current-controlled attenuator.

FIG. 9 shows the cross section of the implemented p-doped-intrinsic-n-doped (PIN) phase modulator which is similar to a previously reported PIN design. The electrical characterization shows that at 2.0 V bias voltage, the input impedance of the PIN can be modelled as an 8Ω resistor in parallel with a 133 pF capacitor. FIG. 10A shows the measurement setup used for insertion loss characterization of the PIN structure as a function of the bias current. An optical probe is used to couple the output of the Agilent 81642A tunable laser into the PIN test structure using the on-chip grating coupler. The test structure output is coupled into an optical fibre and used to measure the optical power. A current source is used to sweep the control current of the PIN structure. The measured insertion loss of the PIN modulator versus current (at 1540 nm) is shown in FIG. 2I.

Figure 10B:
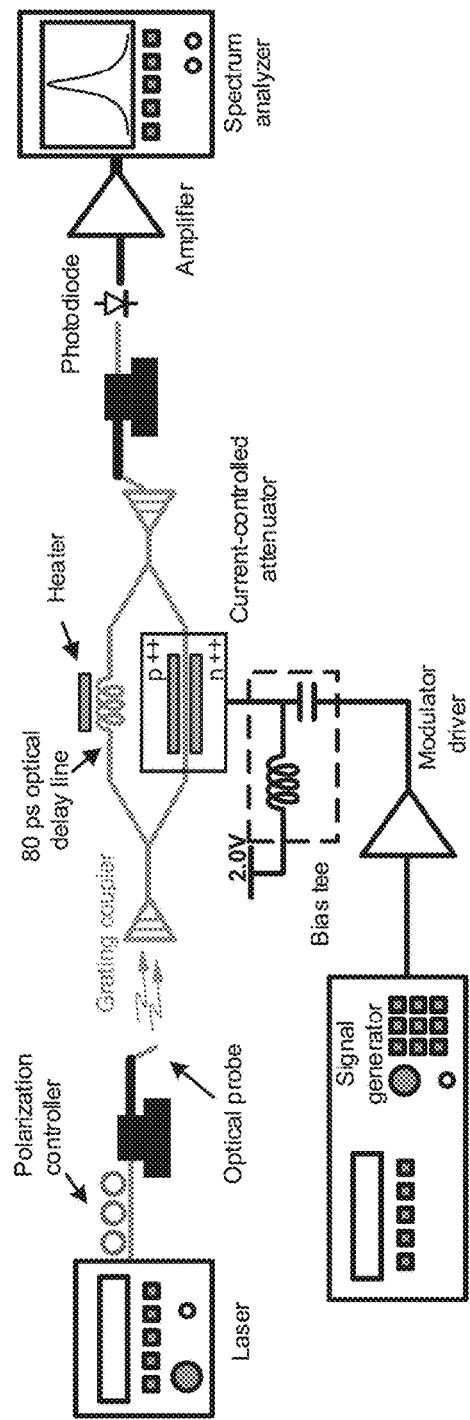
FIG. 10B shows a bandwidth and $i_\pi$ measurement setup.

FIG. 10B shows the measurement setup used for bandwidth characterization. The same reconfigurable MZI used in the PDH system is used for phase modulator characterization. First, the wavelength of the tunable laser and the RF signal power were set to 1540 nm and 0 dBm, respectively. Then, the frequency of the Agilent E4433B RF synthesizer was swept and the output of the test structure was photo-detected, amplified and recorded using an Agilent 8563E spectrum analyser where a 3-dB bandwidth of 150 MHz was measured (FIG. 2G).

The setup shown in Supplementary FIG. 10B can also be used for $i_\pi$ characterization. Consider the case that the laser electric field and the RF signal are written as $E_i = \sqrt{P_0} e^{j\omega_0 t}$ and $v_{mod} = v_0 \sin(\Omega t)$, where $P_0$, $\omega_0$, $v_0$ and $\Omega$ are the laser power, the laser frequency, the RF amplitude and the RF frequency, respectively. Assuming that the relative phase between the arms of the MZI is set to 90°, the electric field at the output of the phase modulator can be written as $$E_{out} = \frac{\sqrt{P_0}}{2} e^{j\omega_0 t} \{ j + \sqrt{\alpha} e^{j\beta \sin(\Omega t)} \}, \quad (12)$$

where α and β represent the optical transmission (in one arm of the MZI) and the modulation index $$\left( \beta \triangleq \frac{v_0}{i_\pi |z_{in}|} \pi \right),$$

respectively. Note that $Z_{in}$ represents the input impedance of the PIN structure. The photo-current in FIG. 10B is written as $$i_{PD}(t) = R|E_{out}|^2 = \frac{P_0 R}{4} \{ 1 + \alpha + 2\sqrt{\alpha} \, \sin(\beta \sin(\Omega t)) \}, \quad (13)$$

where R represents the responsivity of the off-chip photo-diode in the measurement setup. Using the Jacobi-Anger expansion, the AC component of the photo-current is written as $$i_{PD,ac}(t) = P_o R \sqrt{\alpha} \sum_{n=1}^{\infty} J_{2n-1}(\beta) \sin((2n-1)\Omega t). \quad (14)$$

Figure 10C:
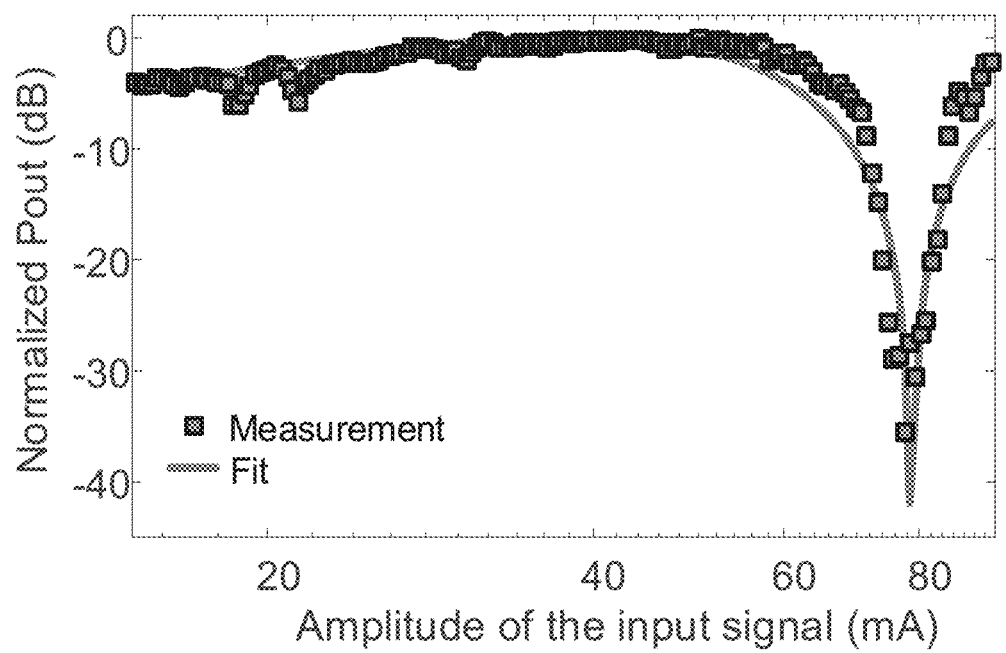
FIG. 10C shows a modulator response versus amplitude of the input signal (at 150 MHz). By fitting a Bessel function of the first kind to the measured data, an $i_\pi$ of 64 mA is estimated.

Therefore, at a given frequency, by fitting a Bessel function of the first kind to the measured AC component of the photo-current, the modulation index and hence $i_\pi$ can be estimated. FIG. 10C shows the modulator photo-current (amplified and monitored on an electrical spectrum ana-lyzer) measured at 150 MHz for different modulator currents where an $i_\pi$ of about 64 mA is estimated.

We have repeated this measurement at different frequencies to plot FIG. 2H.

Figure 11:
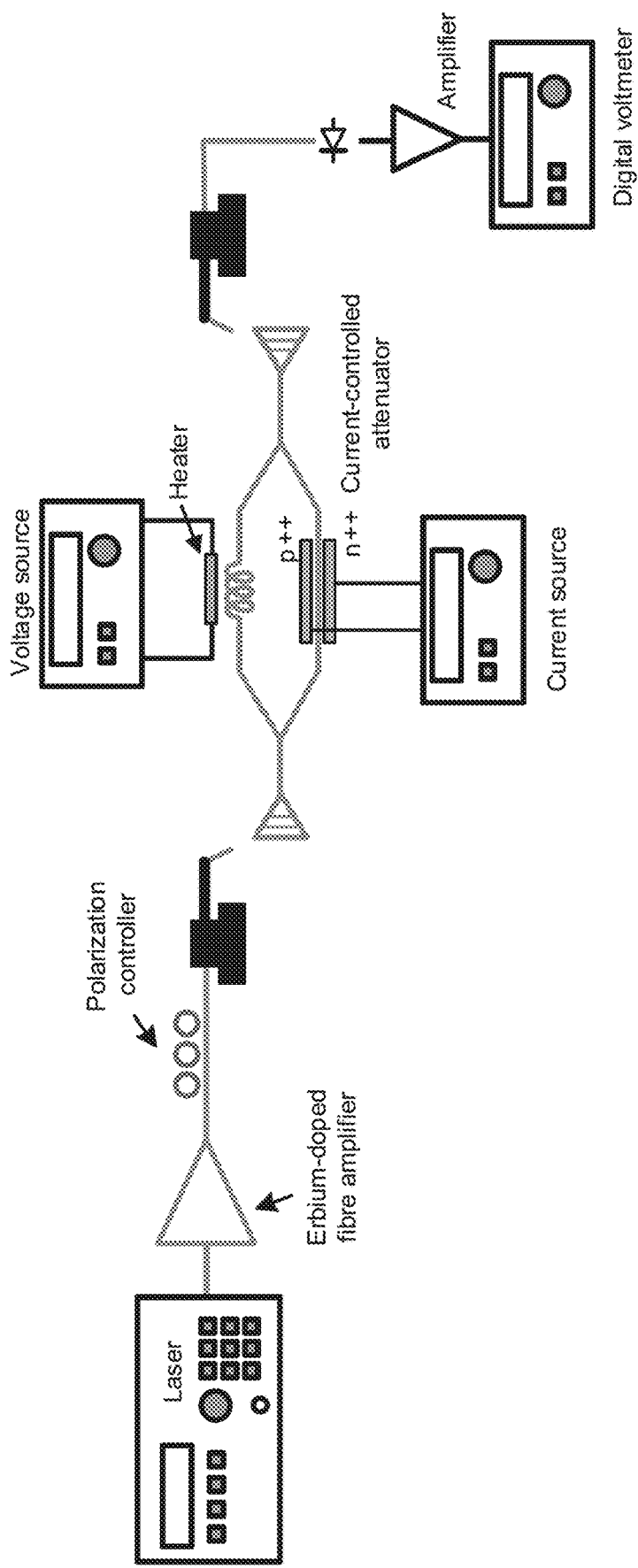
FIG. 11 illustrates a measurement setup for electronically reconfigurable Mach-Zehnder interferometer characterization. The tunable laser output is amplified using an Erbium-doped fibre amplifier (EDFA) and is injected to the electronically reconfigurable Mach-Zehnder interferometer (MZI) after polarization adjustment. The MZI output is photo-detected, amplified and monitored on a digital voltmeter. To maximize the extinction ratio, the current injected to the current-controlled attenuator is adjusted minimizing the loss mismatch between the MZI arms. By setting the voltage applied to the heater, the relative phase between the MZI arms is adjusted.

Supplementary Note 3: Characterization of the Integrated Electronically Reconfigurable Mach-Zehnder Interferometer The measurement setup for the integrated reconfigurable MZI is depicted in FIG. 11. The output of an Agilent 81642A tunable laser is amplified using an Erbium-doped fibre amplifier (EDFA) and coupled into the reconfigurable MZI test structure using an on-chip grating coupler. The output of the MZI test structure is photo-detected, amplified and monitored using a HP 3478A digital voltmeter. By adjusting the current injected to the PIN current-controlled attenuator, the loss mismatch between the two arms of the MZI can be minimized resulting in more than 28 dB extinction ratio as shown in FIG. 3B. Once the loss mismatch between the two arms of the MZI is minimized, the relative phase between the two arms can be adjusted using the heaters placed between the waveguides of the delay line.

Supplementary Note 4: The Frequency Noise Discriminator

Figure 12A:
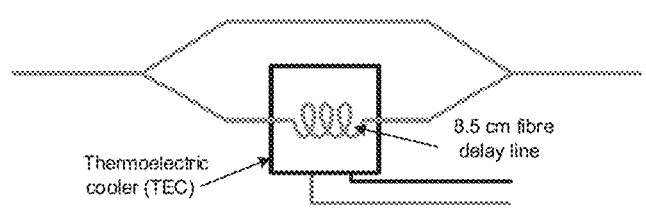
FIG. 12A shows a schematic of the optical fibre based Mach-Zehnder interferometer (MZI) used as a frequency discriminator. The thermoelectric cooler (TEC) is used to thermally adjust the relative phase between the arms of the MZI.

FIG. 12A shows the schematic of the optical fibre based MZI with 8.5 cm length imbalance used as a frequency discriminator in FIG. 6A. A thermoelectric cooler (TEC) is placed under the 8.5 cm delay line to set the relative phase between the two arms of the MZI to 90°. The MZI output is split into two branches using a 50/50 fusion coupler. The bottom branch is photo-detected, amplified and used to monitor the frequency noise of the laser using an Agilent 8563E spectrum analyser. The top branch is used to adjust the relative phase between the two arms of the fibre based MZI using a control unit. The output of the control unit is monitored on an oscilloscope to ensure accurate relative phase adjustment (FIG. 6A).

Figure 12B:
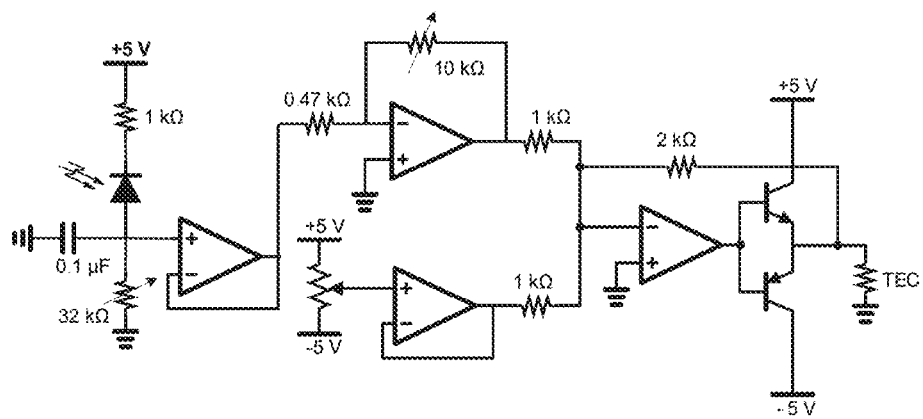
FIG. 12B shows a schematic of the electronic control unit used for relative phase adjustment between the arms of the off-chip frequency discriminator.
Figure 12C:
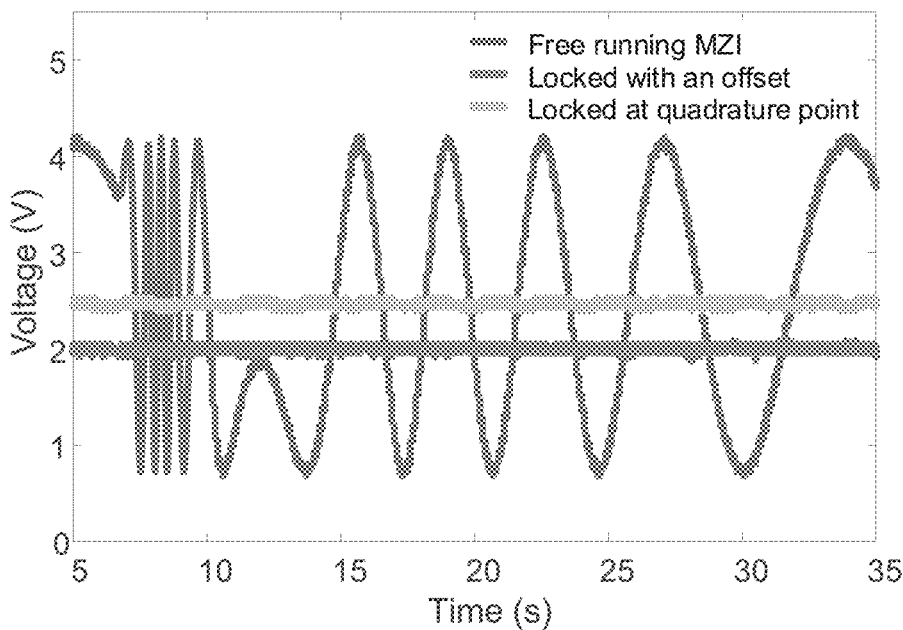
FIG. 12C shows a voltage at the output of the control circuit corresponding to the relative phase between the arms of the frequency discriminator.

FIG. 12B shows the schematic of the control unit used to set the relative phase between the two arms of the off-chip optical fibre based MZI (the frequency discriminator). FIG. 12C shows the output voltage of the control unit which corresponds to the relative phase between the two arms of the frequency discriminator. When the phase control loop is closed, the phase difference between the two arms can be set to 900.

Supplementary Note 5: The CMOS Chip Details

The block diagram of the reported PDH chip is shown in FIG. 13 where all photonic and electronic devices and blocks are monolithically integrated on a CMOS chip except for the photodiode which is hybrid integrated (vertically) with the CMOS chip. The laser output is coupled into the chip using a grating coupler and phase modulated using a PIN phase modulator. The modulated optical signal is guided to the electronically reconfigurable MZI. Control pads are used to adjust the loss in the bottom arm of the MZI using the PIN current-controlled attenuator and the relative phase between the two arms using heaters placed between the delay lines in the top arm. The MZI output is photo-detected using the photodiode chip placed on top of the grating coupler. The photo-current is wire-bonded back to the CMOS chip and amplified and converted to a voltage using a multi-stage TIA. The gain of the TIA can be adjusted using control pads. An offset cancellation loop is designed to compensate for the offset voltage generated as a result of process variation and thermal fluctuations. The TIA output is mixed with the LO signal using a double-balanced mixer. The gain of the mixer can also be controlled using control pads. The mixer output is amplified and low-pass filtered using a multi-stage amplifier with adjustable gain and bandwidth. A VtoI converts the amplifier output voltage to a current which is injected to the laser gain section. The gain of the VtoI can be adjusted using control pads. The output of the on-chip oscillator, the LO signal, is buffered and used to drive the phase modulator (using the modulator driver) and the LO port of the mixer. Signal-ground-signal (SGS) pads are used to monitor the on-chip oscillator output. These pads can also be used to overwrite the on-chip oscillator. The gain and phase responses of the on-chip phase modulator driver can be adjusted through control pads. The schematics of core electronic blocks of the CMOS chip are depicted in FIG. 14A-FIG. 14G. The entire PDH system consumes 237 mW.

Supplementary Note 6: Characterization of the CMOS Electronic Blocks

All electronic blocks have been integrated on the GlobalFoundries GF7RFSOI process, a standard CMOS SOI technology, with no post-processing. The performance of the core electronic blocks (shown in FIG. 14A-FIG. 14G) is summarized in Table 1.

Supplementary Note 7: The Noise Sources

The key noise sources affecting the PDH stabilization performance are the relative intensity noise (RIN) of the laser, the photodiode shot noise and the noise of the electronic devices. The effect of each of these noise sources can be modelled as a current noise referred to the input of the TIA. Since these noise sources are independent, the total noise contribution can be written as the sum of these three current noises.

In presence of laser intensity noise, Supplementary Equation (1) describing the electric field of the laser output, can be modified to $$E_{laser}(t) = \sqrt{P_0 + p_n(t)} \cos(\omega_0 t), \quad (15)$$

where $P_0$, $p_n(t)$ and $\omega_0$, are the laser power, laser intensity noise and the lasing frequency, respectively. In this case and following the same steps taken in derivation of Supplementary Equation (7), the photodiode current can be calculated as $$i_{PD}(t) \approx i_{DC} + \frac{\alpha R}{8}(p_n(t) + p_n(t-\tau)) + \frac{\alpha P_0 R}{4}\left(1 + \frac{(p_n(t) + p_n(t-\tau))}{2P_0}\right)\cos(\omega_0\tau + Z\cos(\Omega t + \psi)) \quad (16)$$

where $i_{DC}$, $\alpha$, $R$, $\tau$ and $\Omega$ are the DC component of the photo-current, the transmission of the optical path, the responsivity of the photodiode, the delay difference between the two arms of the reconfigurable MZI and the modulation frequency, respectively. Also, Z and $\psi$ are defined in Supplementary Equation (8). Note that due to the amplitude limiting mechanism, the amplitude noise of the local oscillator is negligible[4] and is ignored in this analysis. Assuming $$\frac{(p_n(t) + p_n(t-\tau))}{2P_0} \ll 1,$$

Supplementary Equation (16) can be written as $$i_{PD}(t) \approx i_{DC} + \frac{\alpha R}{8}(p_n(t) + p_n(t-\tau)) + \frac{\alpha P_0 R}{4}\cos(\omega_0\tau + Z\cos(\Omega t + \psi)). \quad (17)$$

Assuming $p_n(t)$ to be an additive mean-zero white Gaussian process, the power spectral density (PSD) of the laser intensity noise equivalent current, $i_{RIN}$, can be written as[3]

$$\overline{i_{RIN}^2} = R^2 \overline{[p_n(t) + p_n(t-\tau)]^2} = 2R^2 P_0^2 RIN, \quad (18)$$

where $$RIN = \frac{\overline{p_n^2}}{P_0^2}$$

represents the relative intensity noise of the laser. Therefore, using Supplementary Equation (18) and considering the shot noise of the photodiode, $i_{PD,shot}$, Supplementary Equation (17) is modified to $$i_{PD}(t) \approx i_{DC} + i_{PD,shot} + \frac{\alpha}{8}i_{RIN} + \frac{\alpha P_0 R}{4}\cos(\omega_0\tau + Z\cos(\Omega t + \psi)). \quad (19)$$

The noise contribution of electronic devices can be modelled as a current noise referred to the output of the photodiode[3]. In this case, the total photocurrent including the effect of all aforementioned noise sources is written as $$i_{PD}(t) \approx i_{DC} + i_{noise,total} + \frac{\alpha P_0 R}{4}\cos(\omega_0\tau + Z\cos(\Omega t + \psi)), \quad (20)$$

where $$i_{noise,total} = i_{PD,shot} + \frac{\alpha}{8}i_{RIN} + i_{n,electronics},$$

represents the total input referred current noise and $i_{n,electronics}$ represents the noise of the electronic devices. Since the total current noise is a small signal, the linearized PDH system in FIG. 15 can be used for noise analysis. Note that in this figure, the PDH chip gain (i.e. $\tau K_{OE}$ in FIG. 5) is written as the product of an optical frequency to current gain, $K_{\omega i}$ and the electrical current gain, $A_i$ (introduced in Supplementary Note 1). Using Supplementary Equation (11), the optical frequency to current gain is defined as $$K_{\omega i} \triangleq \frac{1}{2}\tau R P_0 \alpha J_1(\beta\Omega\tau) \sin\left(\theta - \frac{\Omega\tau}{2}\right).$$

Figure 15:
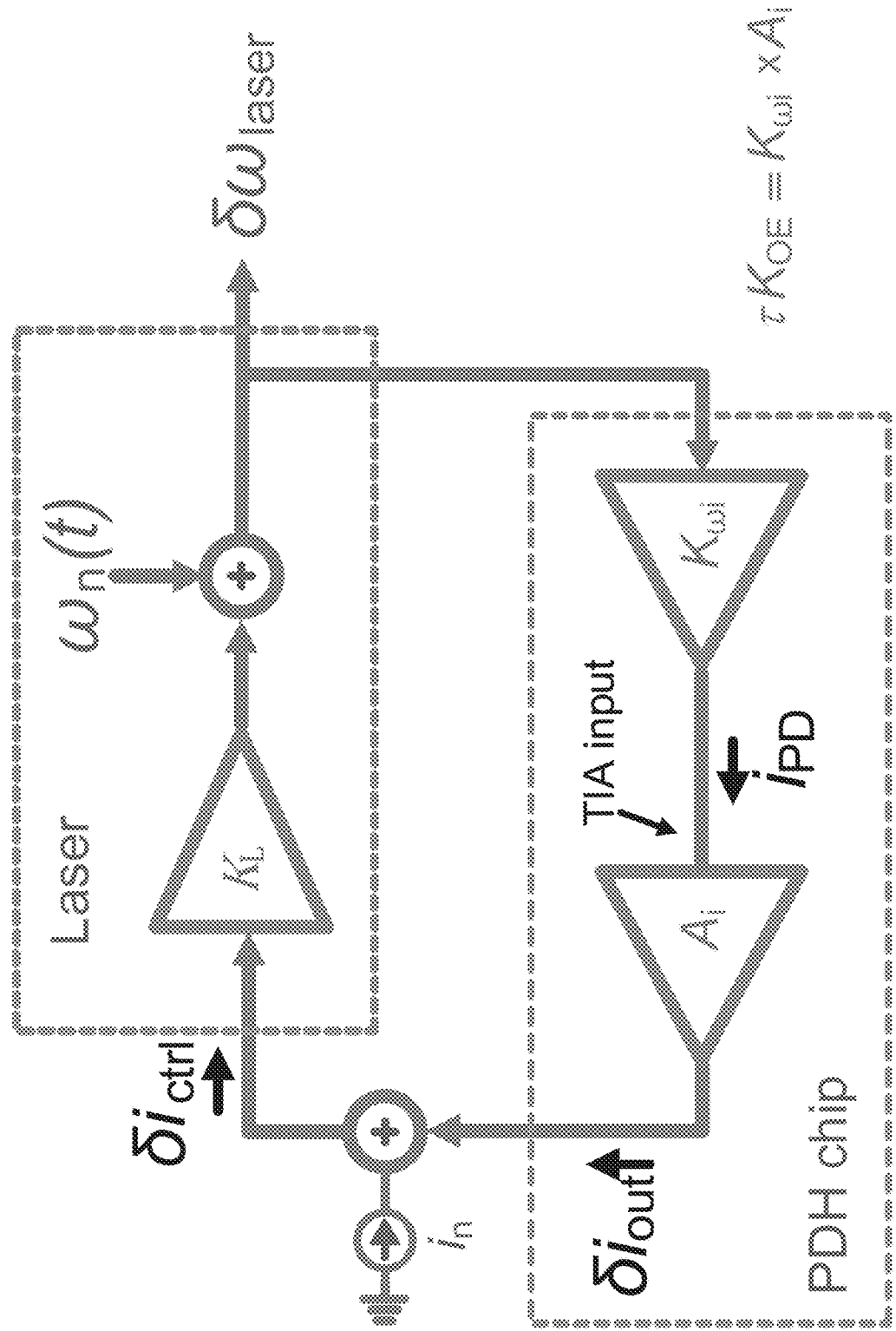
FIG. 15 illustrates a block diagram of the linearized Pound-Drever-Hall system in presence of noise. The block diagram of the linearized Pound-Drever-Hall (PDH) system is shown where the total system noise including the noise of electronic devices and blocks, the photodiode shot noise and the relative intensity noise of the laser is modelled by a current noise, $i_n$, referred to the input of the laser. Under the closed-loop condition, the control current, $\delta i_{ctrl}$, is written as the sum of the total noise, $i_n$, and the small signal output current of the PDH chip, $\delta i_{out}$. In this case, the total frequency noise of the laser, $\delta \omega_{laser}$, would be the sum of the laser intrinsic frequency noise, $\omega_n$ (t), and the amplified current noise, $K_L i_n$, where $K_L$ represents the small signal laser current-to-frequency conversion gain. The total laser frequency noise is amplified by the optical frequency to electrical current gain, $K_{\omega i}$, and the resulting photo-current, $i_{PD}$, is amplified by the current gain of the electronics, $A_i$, producing the PDH chip output current. When the PDH loop is engaged, the total noise is suppressed by the loop gain, $K_{Loop}=|K_{\omega i} A_i K_L|=|\tau K_{OE} K_L|$, where $\tau$ and $K_{OE}$ represent the delay difference between the arms of the reconfigurable Mach-Zehnder interferometer and the optical to electrical conversion gain, respectively.

In this case, the total current noise referred to the output of the CMOS chip, $i_n$ in FIG. 15, is written as $$I_n = A_i \times i_{noise,total} = A_i \times \left(i_{PD,shot} + \frac{\alpha}{8}i_{RIN} + i_{electronics}\right). \quad (21)$$

The control current injected to the laser in FIG. 15 is written as $$\delta i_{ctrl} = \delta i_{out} + i_n. \quad (22)$$

In this case, when the PDH loop is closed, the total laser frequency noise is written as $$\delta\omega_{laser} = \frac{\omega_n(t)}{1+K_{Loop}} + \frac{K_L}{1+K_{Loop}} i_n, \quad (23)$$

where $K_{Loop}=|K_{\omega i}\,A_i K_L|=|\tau K_{OE} K_L|$ is the PDH loop gain and $\omega_n(t)$ represents the intrinsic frequency noise of the laser. Supplementary Equation (23) indicates that when the PDH stabilization loop is engaged, the contribution of the electro-optic noise (the noise of electronic devices, the photodiode shot noise and the relative intensity noise of the laser) to the laser frequency noise is suppressed by the loop gain.

Supplementary Note 8: Hybrid Integration of the Photodiode and the CMOS Chip

Despite successful monolithic integration of all active and passive photonic and electronic devices on the GF7RFSOI process, a wideband photodiode with high responsivity was not implemented as no material with efficient absorption coefficient in the 1550 nm range is available in this standard electronic process. Therefore, a photodiode chip is hybrid integrated (vertically) with the CMOS chip as depicted in FIG. 1B and FIG. 1C.

A Cosemi LX3050 InGaAs/InP PIN photodiode chip with a die area of 450 μm×450 μm and thickness of 152 μm was mounted on top of the CMOS chip. The active area of this vertically illuminated photodiode is about 800 μm² (diameter of about 32 μm) which is more than 4 times larger than the grating coupler area (in FIG. 2A) resulting in a relatively relaxed alignment tolerance. To hybrid integrate the photodiode with the CMOS chip, the photodiode was placed on top of the CMOS chip and was moved using a DC probe and aligned with the grating coupler using markers. Once the photodiode was aligned with the grating coupler, a drop of Loctite Instant Mix epoxy was placed at the corner of the CMOS chip flowing and surrounding the photodiode chip. When the epoxy was cured, the photodiode pads were wire-bonded to the input pads of the CMOS chip as shown in FIG. 1C. Note that the photodiode can be backside-illuminated since its substrate is substantially transparent at 1550 nm. This process that we have developed previously[5] is reliable and repeatable. The measured average coupling loss is under 1.8 dB which is lower than the coupling loss between a grating coupler and an optical fibre in the GF7RFSOI process (FIG. 2B).

EXAMPLES

Most laser based communication systems use intensity modulation, which means encoding the information solely in the light wave's intensity. For simplicity's sake, a "1" is when the laser light is on and a "0" is when it is off. But lasers also have other properties: frequency, which is how fast the wave's up-and-down cycle is repeated, and phase, which is how far the start of each cycle is from a fixed reference point.

To transmit a single bit using only intensity modulation, the laser light just needs to be either on or off at preset intervals, each representing either 0 or 1. A laser capable of emitting four discrete phases, however, could transmit data twice as fast. Each of the phases would represent one of the four two-bit permutations at each interval, 00, 01, 10, or 11. Combining more phase and intensity levels other than simply "on" and "off" could further multiply the data rate. Encoding information in four phase points and two intensity levels would allow for the eight three-bit permutations, tripling the data rate. Eight phases and two intensities would allow for the sixteen four-bit permutations, quadrupling it. Critically, this system only works if the laser can reliably emit with the correct phase in each interval. Lasers that are low-noise enough to do so are prohibitively expensive for consumer products, and mass-market lasers are typically too noisy to carry information using properties beyond simple on-or-off intensity.

This noise arises from the quality of a laser's cavity and the "gain medium" within it. Generally, lasers are produced by bouncing light back and forth in a cavity between two mirrors. Because light loses energy as it travels inside the cavity, a gain medium is placed in the light's path. In a process known as stimulated emission, after applying electric current to the laser's gain medium, photons are released that are lined up with the light passing through it, amplifying it into a laser beam.

During this amplification process, some photons are also generated at random, which in turn generate noise in the laser. High quality cavities can significantly reduce this so-called 'spontaneous emission' noise resulting in a lower noise laser. However, cavities with a high quality factor are expensive and often bulky or complex to design. Putting them together is costly and time consuming, since the process must be extremely precise. The technology is there, but manufacturers only make a few hundred of them a year. They're just too complex and expensive to mass-produce.

Instead of using expensive lasers with a complex or bulky cavity, the researchers' PDH chip could be used in conjunction with lasers that have simpler, lower quality cavities. We measure the noise in the phase of the laser coming mainly from randomly generated photons in the laser cavity and feed it back as a current to the laser gain medium. This suppresses the noise in the phase of the laser.

The researchers are then able to tap off a "clean" laser after this feedback loop, replicating the performance of a much more expensive device using a chip that's about a square millimeter in size. Similar to CMOS electronic chips in your cell phone, these PDH chips can be mass-produced. You could make 100,000 of them for a few dollars each. Then each chip can be combined with a low-cost lower quality laser, the same kind that's currently being used in fiber optic internet. Adding in assembly, the total cost of manufacturing 100,000 integrated packaged lasers using this technology would probably be around a few tens of dollars per unit, compared to a few thousands of dollars for an equivalent low-noise, stable lasers available today.

The potential uses of such a laser are not limited to communications. Many pieces of scientific equipment also require lasers with high stability.

This technology can be implemented for different wavelengths enabling implementation of low-cost, portable spectrometers for medical diagnostics. Current systems often use a bulky and expensive laser. Cheap, low noise lasers could significantly decrease the lab process time by allowing many more spectrometers to run in parallel, and also would make spectrometers cheap enough to be available in all labs around the globe.

Those skilled in the art also will readily appreciate that many additional modifications are possible in the exemplary embodiment without materially departing from the novel teachings and advantages of the invention. Accordingly, any such modifications are intended to be included within the scope of this invention as defined by the following exemplary claims.

What is claimed:

1. A laser frequency control apparatus comprising:
a laser;
an oscillator configured to receive an output of the laser and to output a modulating signal comprising one or more of a phase modulated signal or an intensity modulated signal;
a frequency reference configured to receive the modulated signal and to provide an output signal; and
a mixer configured to mix at least a portion of the output signal of the frequency reference with an output of the oscillator to generate a mixer output,
wherein the mixer output is injected to a section of the laser.

2. The laser frequency control apparatus of claim 1, wherein the frequency reference comprises one or more of an interferometer, a resonator, or a cavity.

3. The laser frequency control apparatus of claim 2, wherein the interferometer comprises a Mach-Zehnder interferometer.

4. The laser frequency control apparatus of claim 1, wherein the section of the laser comprises a gain section.

5. The laser frequency control apparatus of claim 1, wherein the section of the laser comprises a phase section.

6. The laser frequency control apparatus of claim 1, wherein the section of the laser comprises a mirror section.

7. The laser frequency control apparatus of claim 1, further comprising a photodetector configured to receive the output signal of the frequency reference and to output a photocurrent.

8. The laser frequency control apparatus of claim 7, further comprising an amplifier configured to convert the photocurrent to a voltage.

9. The laser frequency control apparatus of claim 8, wherein the amplifier comprises a trans-impedance amplifier.

10. The laser frequency control apparatus of claim 1, further comprising a low-pass filter configured to filter the mixer output prior to being injected to the section the laser.

11. The laser frequency control apparatus of claim 1, wherein the oscillator comprises an electrical local oscillator.

12. The laser frequency control apparatus of claim 1, wherein the apparatus occupies an area of less than 2.5 mm$^2$.

13. The laser frequency control apparatus of claim 1, wherein the apparatus occupies an area of less than 2.4 mm$^2$.

14. The laser frequency control apparatus of claim 1, wherein the apparatus occupies an area of about 2.38 mm$^2$ or less.

15. The laser frequency control apparatus of claim 1, wherein the laser, the oscillator, the frequency reference, and the mixer are integrated on a CMOS chip.

16. A method, comprising:
making an apparatus comprising;
a laser;
an oscillator configured to receive an output of the laser and to output a modulating signal comprising one or more of a phase modulated signal or an intensity modulated signal;
a frequency reference configured to receive the modulated signal and to provide an output signal; and
a mixer configured to mix at least a portion of the output signal of the frequency reference with an output of the oscillator to generate a mixer output,
wherein the mixer output is injected to a section of the laser.

17. A method comprising;
using an apparatus comprising
a laser;
an oscillator configured to receive an output of the laser and to output a modulating signal comprising one or more of a phase modulated signal or an intensity modulated signal;
a frequency reference configured to receive the modulated signal and to provide an output signal; and
a mixer configured to mix at least a portion of the output signal of the frequency reference with an output of the oscillator to generate a mixer output,
wherein the mixer output is injected to a section of the laser.

* * * * *

UNITED STATES PATENT AND TRADEMARK OFFICE
CERTIFICATE OF CORRECTION

PATENT NO. : 10,700,492 B2
APPLICATION NO. : 16/239653
DATED : June 30, 2020
INVENTOR(S) : Idjadi et al.

Page 1 of 1

It is certified that error appears in the above-identified patent and that said Letters Patent is hereby corrected as shown below:

In the Claims

In Claim no. 10, Column no. 21, Line no. 39, Replace:
"mixer output prior to being injected to the section the laser."

With:
--mixer output prior to being injected to the section of the laser.--

In Claim no. 16, Column no. 22, Line no. 12, Replace:
"making an apparatus comprising;"

With:
--making an apparatus comprising:--

In Claim no. 17, Column no. 22, Line no. 26 and 27, Replace:
"A method comprising;
using an apparatus comprising"

With:
--A method, comprising:
using an apparatus comprising:--

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*